United States Patent
Bhattacharyya

(10) Patent No.: US 7,115,948 B2
(45) Date of Patent: *Oct. 3, 2006

(54) TRANSISTOR CONSTRUCTIONS AND ELECTRONIC DEVICES

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/168,697

(22) Filed: Jun. 27, 2005

(65) Prior Publication Data
US 2005/0247982 A1 Nov. 10, 2005

Related U.S. Application Data

(63) Continuation of application No. 10/364,271, filed on Feb. 10, 2003.

(51) Int. Cl.
*H01L 27/01* (2006.01)
(52) U.S. Cl. .................. 257/347; 257/352; 257/353; 257/349; 257/616
(58) Field of Classification Search ............ 257/347, 257/352, 353, 349, 616; 438/149, 479, 517
See application file for complete search history.

(56) References Cited

U.S. PATENT DOCUMENTS

| | | | |
|---|---|---|---|
| 4,870,470 A | | 9/1989 | Bass, Jr. et al. |
| 5,051,786 A | * | 9/1991 | Nicollian et al. ............ 257/22 |
| 5,140,391 A | * | 8/1992 | Hayashi et al. ............ 257/365 |
| 5,614,433 A | | 3/1997 | Mandelman |
| 5,698,869 A | | 12/1997 | Yoshimi et al. |
| 5,847,419 A | | 12/1998 | Imai et al. |
| 5,877,048 A | | 3/1999 | Wu |
| 6,121,653 A | | 9/2000 | Juengling |
| 6,210,998 B1 | | 4/2001 | Son |
| 6,222,215 B1 | | 4/2001 | Zahurak |
| 6,335,233 B1 | | 1/2002 | Cho et al. |
| 6,337,500 B1 | | 1/2002 | Nakaoka et al. |
| 6,437,375 B1 | | 8/2002 | Beaman |

(Continued)

FOREIGN PATENT DOCUMENTS

DE 4213945 A1 11/1992

(Continued)

OTHER PUBLICATIONS

Ono, K. et al., "Analysis of Current-Voltage Characteristics in Polysilicon TFTs for LCD,", IEDM Tech. Digest, 1988, pp. 256-259.

(Continued)

Primary Examiner—Eugene Lee
(74) Attorney, Agent, or Firm—Wells St. John P.S.

(57) ABSTRACT

The invention includes a non-volatile memory cell comprising a field effect transistor construction having a body region within a crystalline material. The body region includes a charge trapping region. The memory cell can be TFT-SOI based, and can be supported by a substrate selected from a diverse assortment of materials. The top portion of the substrate can be a conductive layer separated from the memory device by the SOI-oxide insulator film. The charge trapping region can be, for example, silicon enriched silicon nitride or silicon enriched silicon oxide. The crystalline material can include silicon and germanium. The transistor comprises first and second diffusion regions within the body region, and also comprises a channel region between the first and second diffusion regions. The entirety of the body region within the crystalline material can be within a single crystal of the material.

66 Claims, 23 Drawing Sheets

U.S. PATENT DOCUMENTS

| | | | |
|---|---|---|---|
| 6,479,866 B1* | 11/2002 | Xiang | 257/347 |
| 6,509,613 B1 | 1/2003 | En et al. | |
| 6,512,244 B1 | 1/2003 | Ju et al. | |
| 6,515,335 B1 | 2/2003 | Christiansen et al. | |
| 6,528,853 B1 | 3/2003 | Christensen et al. | |
| 6,538,284 B1 | 3/2003 | Riccobene et al. | |
| 6,541,861 B1 | 4/2003 | Higashi et al. | |
| 6,555,839 B1 | 4/2003 | Fitzgerald | |
| 6,607,948 B1 | 8/2003 | Sugiyama et al. | |
| 6,633,066 B1* | 10/2003 | Bae et al. | 257/347 |
| 6,635,928 B1 | 10/2003 | Mouli | |
| 6,765,227 B1* | 7/2004 | Yu et al. | 257/19 |
| 6,787,793 B1 | 9/2004 | Yoshida | |
| 6,803,273 B1* | 10/2004 | Ambrose et al. | 438/257 |
| 2003/0006461 A1* | 1/2003 | Tezuka et al. | 257/347 |
| 2004/0041208 A1 | 3/2004 | Bhattacharyya | |

FOREIGN PATENT DOCUMENTS

JP         63250812 A  * 10/1988

OTHER PUBLICATIONS

Yamauchi, N. et al., "Drastically Improved Performance in Poly-Si TFTs with Channel Dimensions Comparable to Grain Size", IEDM Tech. Digest, 1989, pp. 353-356.

King, T. et al, "A Low-Temperature (≦550°C) Silicon-Germanium MOS Thin-Film Transistor Technology for Large-Area Electronics", IEDM Tech. Digest, 1991, pp. 567-570.

Kuriyama, H. et al., "High Mobility Poly-Si TFT by a New Excimer Laser Annealing Method for Large Area Electronics", IEDM Tech. Digest, 1991, pp. 563-566.

Jeon, J. et al., "A New Poly-Si TFT with Selectivity Doped Channel Fabricated by Novel Excimer Laser Annealing", IEDM Tech. Digest, 2000, pp. 213-216.

Kim, C.H. et al., "A New High -Performance Poly-Si TFT by Simple Excimer Laser Annealing on Selectively Floating a-Si Layer", IEDM Tech. Digest, 2001, pp. 751-754.

Hara, A. et al, "Selective Single-Crystalline-Silicon Growth at the Pre-Defined Active Regions of TFTs on a Glass by a Scanning CW Layer Irradiation", IEDM Tech. Digest, 2000, pp. 209-212.

Hara, A. et al., "High Performance Poly-Si TFTs on a Glass by a Stable Scanning CW Laser Lateral Crystallization", IEDM Tech. Digest, 2001, pp. 747-750.

Jagar, S. et al., "Single Grain Thin-Fim-Transistor (TFT) with SOI CMOS Performance Formed by Metal-Induced-Lateral-Crystallization", IEDM Tech. Digest, 1999, p. 293-296.

Gu, J. et al., "High Performance Sub-100 nm Si Thin-Film Transistors by Pattern-Controlled Crystallization of Thin Channel Layer and High Temperature Annealing", DRC Conference Digest, 2002, pp. 49-50.

Kesan, V. et al., "High Performance 0.25μm p-MOSFETs with Silicon- Germanium Channels for 300K and 77K Operation", IEDM Tech. Digest, 1991, pp. 25-28.

Garone, P.M. et al., "Mobility Enhancement and Quantum Mechanical Modeling in $Ge_xSi_{1-x}$ Channel MOSFETs from 90 to 300K", IEDM Tech. Digest, 1991, pp. 29-32.

Feder, B.J., "I.B.M. Finds Way to Speed Up Chips", The New York Times, Jun. 8, 2001, reprinted from http://www.nytimes.com/2001/06/08 /technology/08BLUE.html. 2 pgs.

Rim, K. et al., "Strained Si NMOSFET's for High Performance CMOS Technology", 2001 Sympos. on VLSI Tech. Digest of Technical Papers, p. 59-60.

Li, P. et al., "Design of High Speed Si/SiGe Heterojunction Complementary MOSFETs with Reduced Short-Channel Effects", Natl. Central University, ChungLi, Taiwan, ROC, Aug. 2001, Contract No. NSC 89-2215-E-008-049, National Science Council of Taiwan., pp. 1, 9.

Ernst, T. et al., "Fabrication of a Novel Strained SiGe:C-channel Planar 55 nm nMOSFET for High-Performance CMOS", 2002 Sympos. on VLSI Tech. Digest of Technical Papers, pp. 92-93.

Rim, K. et al., "Characteristics and Device of Sub-100 nm Strained SiN- and PMOSFETs", 2002 Sympos. on VLSI Tech. Digest of Technical Papers, pp. 98-99.

Belford, R.E. et al., "Performance-Augmented CMOS Using Back-End Uniaxial Strain", DRC Conf. Digest, 2002, pp. 41-42.

Shima, M. et al., "<100> Channel Strained-SiGe p-MOSFET with Enhanced Hole Mobility and Lower Parasitic Resistance", 2002 Sympos. on VLSI Tech. Digest of Technical Papers, pp. 94-95.

Nayfeh, H.M. et al., "Electron Inversion Layer Mobility in Strained-Si n-MOSFETs with High Channel Doping Concentration Achieved by Ion Implantation", DRC Conf. Digest, 2002, pp. 43-44.

Bee, G.J. et al., "A Novel SiGe-inserted SOI Structure for High Performance PDSOI CMOSFET", IEDM Tech. Digest, 2000, pp. 667-670.

Cheng, Z. et al., "SiGe-on-Insulator (SGOI): Substrate Preparation and MOSFET Fabrication for Electron Mobility Evaluation" and conference outline, MIT Microsystems, Tech. Labs, Cambridge, MA, 2001 IEEE Internatl. SOI Conf., Oct. 2001, pp. 13-14, 3-pg. outline.

Huang, L.J. et al., "Carrier Mobility Enhancement in Strained Si-on-Insulator Fabricated by Wafer Bonding", 2001 Sympos. on VLSI Tech. Digest of Technical Papers, pp. 57-58.

Mizuno, T. et al., "High Performance CMOS Operation of Strained-SOI MOSFETs Using Thin Film SiGe-on-Insulator Substrate", 2002 Sympos. on VLSI Tech. Digest of Technical Papers, p. 106-107.

Tezuka, T. et al., "High-Performance Strained Si-on-Insulator MOSFETs by Novel Fabrication Processes Utilizing Ge-Condensation Technique", 2002 VLSI Tech. Digest of Technical Papers, pp. 96-97.

Takagi, S., "Strained-Si- and SiGe-on-Insulator (Strained SOI and SGOI) MOSFETs for High Performance/Low Power CMOS Application", DRC Conf. Digest, 2002, pp. 37-40.

"IBM Builds World's Fastest Communications Microchip", Reuters U.S. Company News, Feb. 25, 2002, reprinted from http://activequote300.fidelity.com/rtnews/ individual_n... /..., 1 pg.

Markoff, J., "I.B.M. Circuits are Now Faster and Reduce Use of Power", The New York Times, Feb. 25, 2002, reprinted Mar. 20, 2002 from http://story.news.yahoo.com/ news?tmpl=story&u=/nyt/20020225/..., 1 pg.

Park, J.S. et al., "Normal Incident SiGe/Si Multiple Quantum Well Infrared Detector", IEDM Tech. Digest, 1991, pp. 749-752.

Current, M.I. et al., "Atomic-Layer Cleaving with $Si_xGe_y$ Strain Layers for Fabrication of Si and Ge-Rich SOI Device Layers", 2001 IEEE Internatl. SOI Conf. Oct. 2001, pp. 11-12.

Bhattacharyya, A., "The Role of Microelectronic Integration in Environmental Control: A Perspective", Mat. Res. Soc. Symp. Proc. vol. 344, 1994, pp. 281-293.

Myers, S.M. et al., "Deuterium Interactions in Oxygen-Implanted Copper", J. Appl. Phys., vol. 65(1), Jan. 1, 1989, p. 311-321.

Saggio, M. et al., "Innovative Localized Lifetime Control in High-Speed IGBTs", IEEE Elec. Dev. Lett., V. 18, No. 7, Jul. 1997, pp. 333-335.

Lu, N.C.C. et al., "A Buried-Trench DRAM Cell Using a Self-Aligned Epitaxy Over Trench Technology", IEDM Tech. Digest, 1988, pp. 588-591.

Yamada, T. et al., "Spread Source/Drain (SSD) MOSFET Using Selective Silicon Growth for 64Mbit DRAMs", IEDM Tech. Digest, 1989, pp. 35-38.

van Meer, H. et al., "Ultra-Thin Film Fully-Depleted SOI CMOS with Raised G/S/D Device Architecture for Sub-100 nm Applications", 2001 IEEE Internatl. SOI Conf. Oct. 2001, pp. 45-46.

Rim, K. et al., "Characteristics and Device Design of Sub-100 nm Strained Si N- and PMOSFET's", IEEE 2002 Sympos. On VLSI Tech. Digest of Technical Papers, pp. 98-99.

Abstract: Bhattacharyya, A. et al, 691 RNP "Physical and Electrical Characteristics of LPCVD Si-Rich Nitride", J. Electrochem. Soc.: Reviews and News, vol. 131, No. 11, p. 469C (no date).

Frohman-Bentchkowsky, "An Integrated Metal-Nitride-Oxide-Silicon (MNOS) Memory", Journal: Proceedings of the IEEE Jun. 1969, vol. 57, No. 6, pp. 1190-1192.

Ohsawa, T. et al., "9.1: Memory Design Using One-Transistor Gain Cell on SOI", 2002 IEEE International Solid-State Circuits Conference, Digest of Technical Papers, Feb. 2002, 5 pages.

Okhonin, S. et al, "A SOI Capacitor-Less 1T-DRAM Concept", 2001 IEEE International SOI Oct. 2001, pp. 153-154.

* cited by examiner

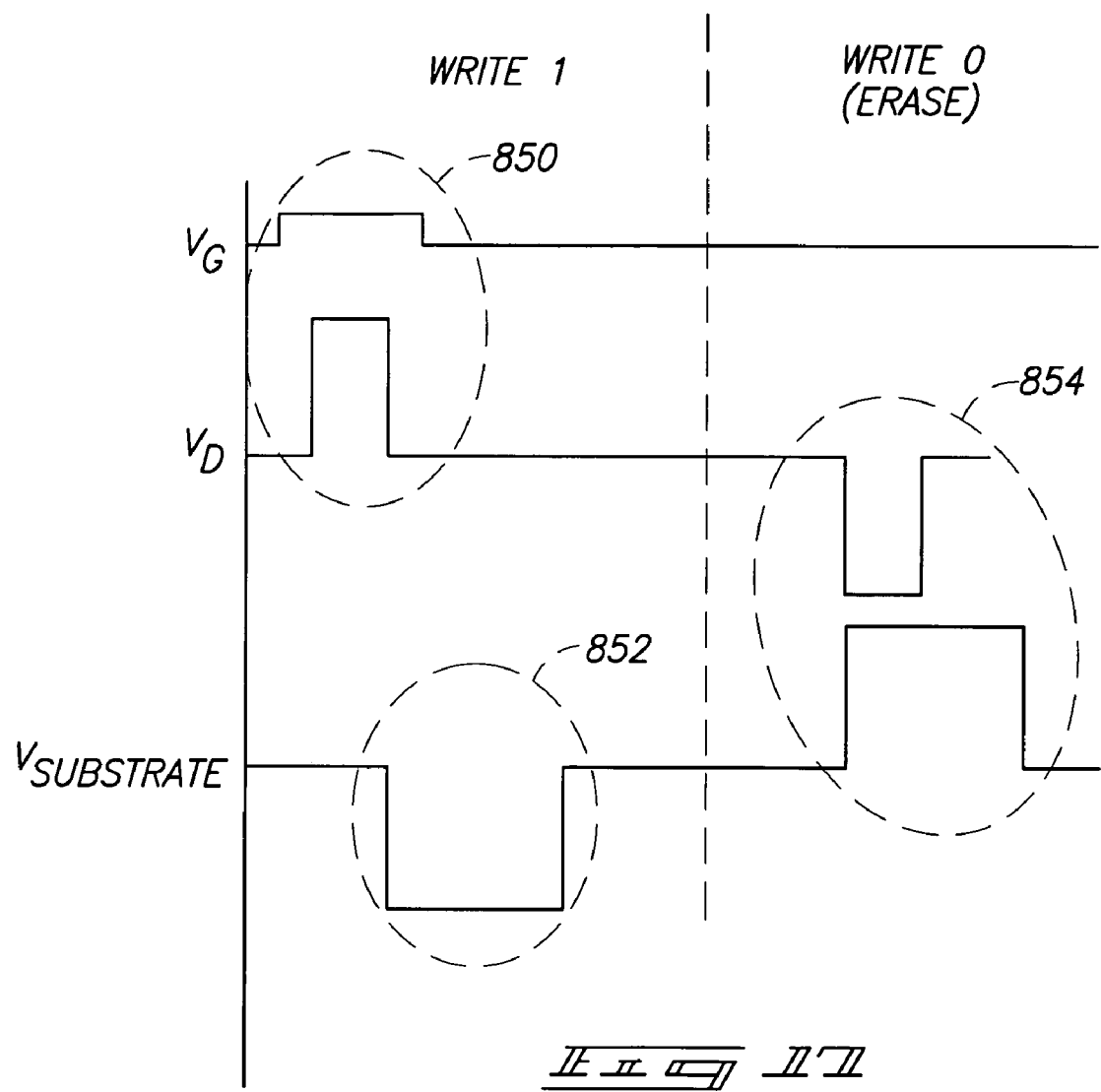

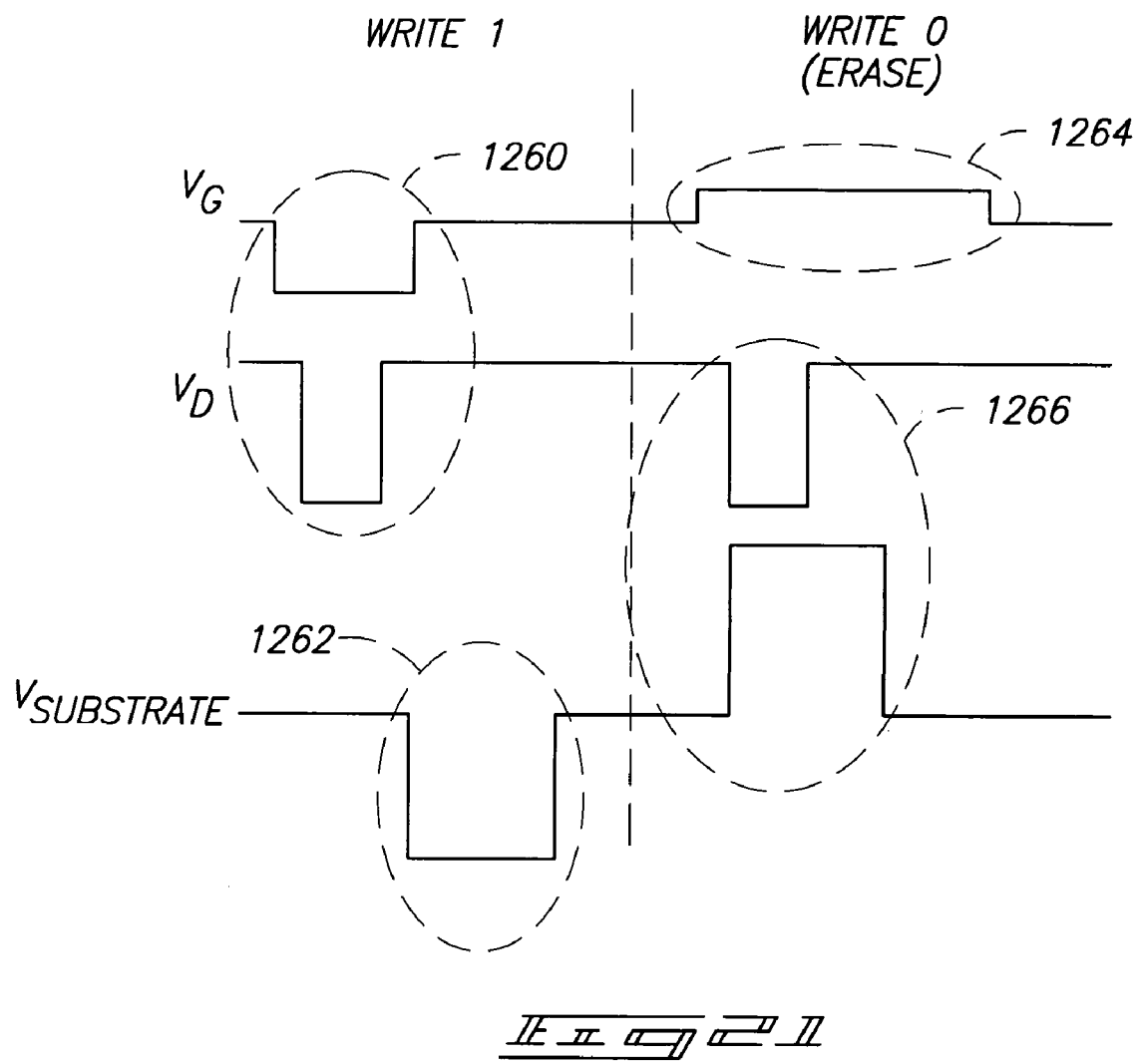

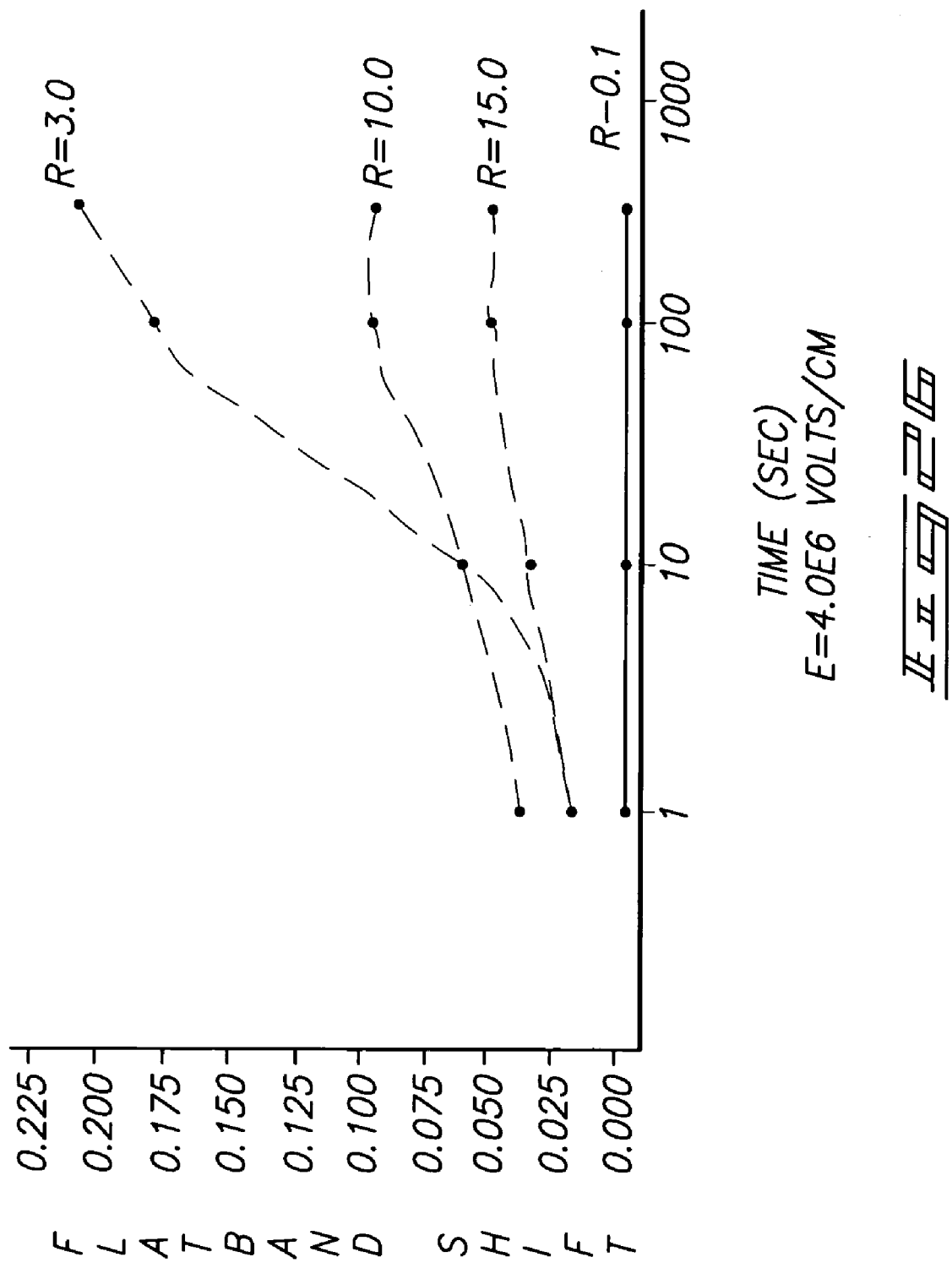

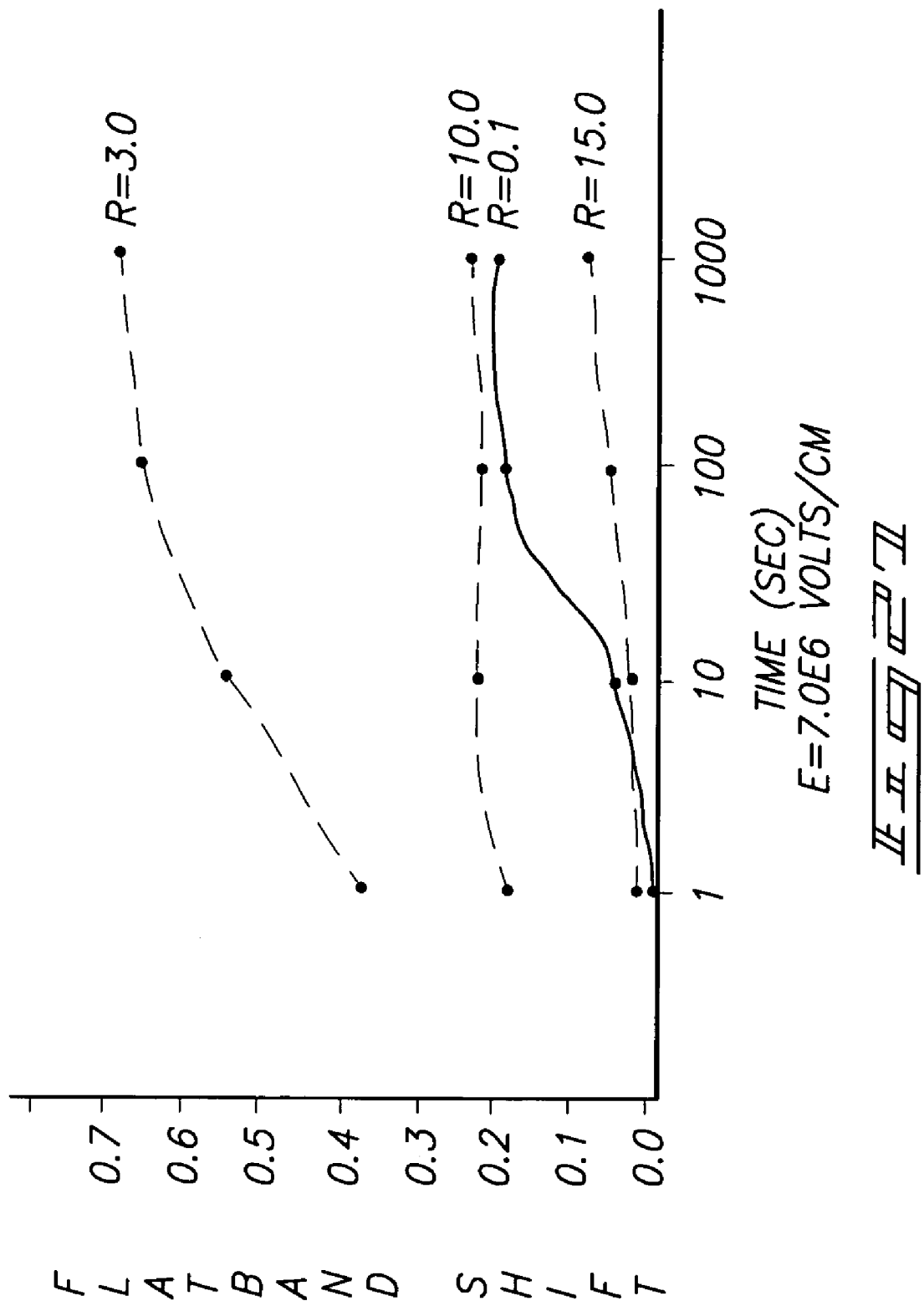

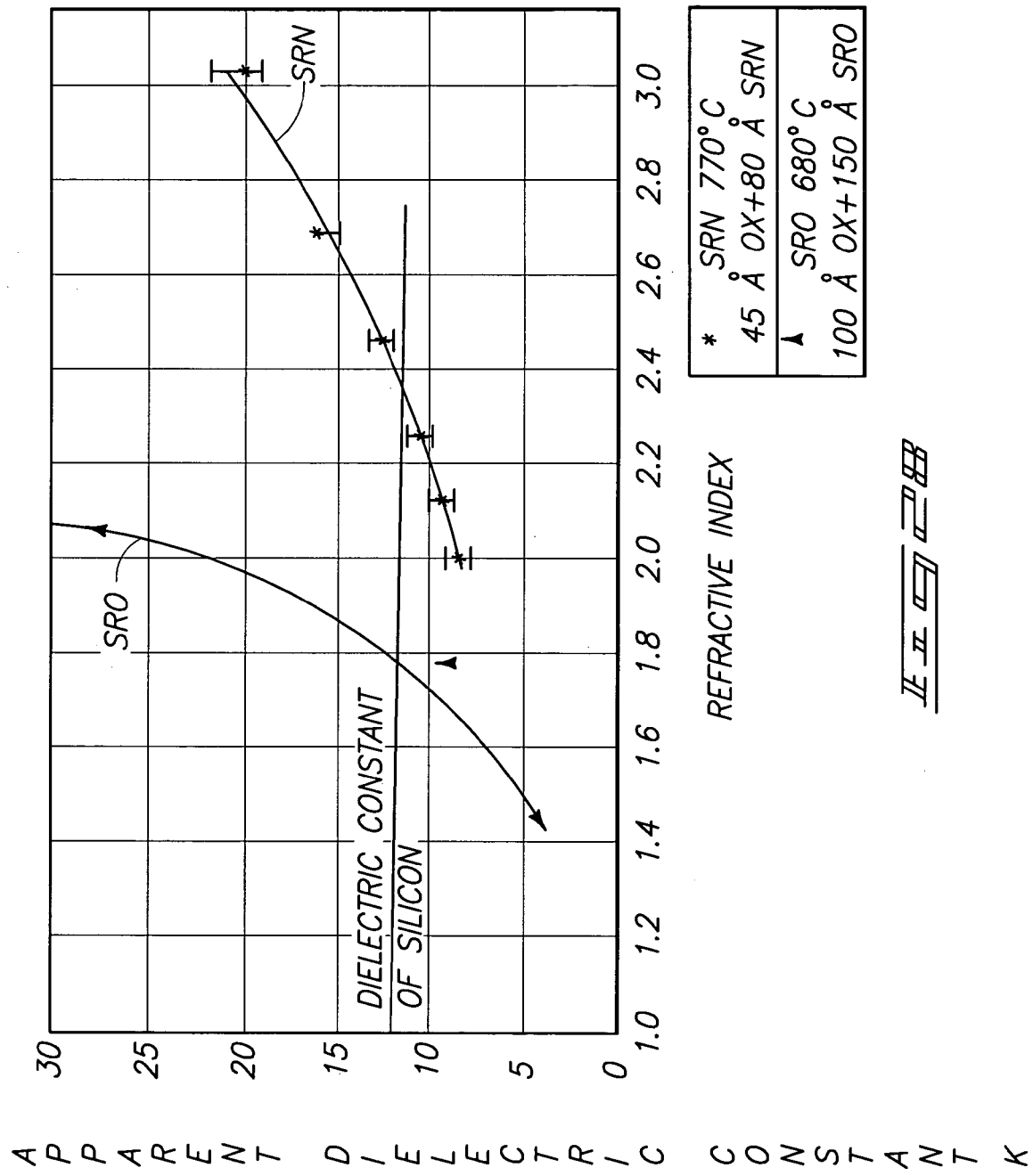

TRANSISTOR CONSTRUCTIONS AND ELECTRONIC DEVICES

This patent resulted from a continuation application of U.S. patent application Ser. No. 10/364,271, which was filed Feb. 10, 2003, and which is now U.S. Pat. No. 7,042,052.

TECHNICAL FIELD

This disclosure relates generally to integrated circuits. In particular aspects, the invention pertains to non-volatile, semiconductor-on-insulator (SOI) memory cells. In particular aspects, the memory cells are SOI-thin film transistor based, built over a versatile base (or substrate).

BACKGROUND OF THE INVENTION

SOI technology differs from traditional bulk semiconductor technologies in that the active semiconductor material of SOI technologies is typically much thinner than that utilized in bulk technologies. The active semiconductor material of SOI technologies will typically be formed as a thin film over an insulating material (typically oxide), with exemplary thicknesses of the semiconductor film being less than or equal to 2000 Å. In contrast, bulk semiconductor material will typically have a thickness of at least about 200 microns. The thin semiconductor of SOI technology can allow higher performance and lower power consumption to be achieved in integrated circuits than can be achieved with similar circuits utilizing bulk materials.

An exemplary integrated circuit device that can be formed utilizing SOI technologies is a so-called thin film transistor (TFT), with the term "thin film" referring to the thin semiconductor film of the SOI construction. In particular aspects, the semiconductor material of the SOI construction can be silicon, and in such aspects the TFTs can be fabricated using recrystallized amorphous silicon or polycrystalline silicon. The silicon can be supported by an electrically insulative material (such as silicon dioxide), which in turn is supported by an appropriate substrate. Exemplary substrate materials include glass, bulk silicon and metal-oxides (such as, for example, $Al_2O_3$). If the semiconductor material comprises silicon, the term SOI is occasionally utilized to refer to a silicon-on-insulator construction, rather than the more general concept of a semiconductor-on-insulator construction. However, it is to be understood that in the context of this disclosure the term SOI refers to semiconductor-on-insulator constructions. Accordingly, the semiconductor material of an SOI construction referred to in the context of this disclosure can comprise other semiconductive materials in addition to, or alternatively to, silicon; including, for example, germanium.

A problem associated with conventional TFT constructions is that grain boundaries and defects can limit carrier mobilities. Accordingly, carrier mobilities are frequently nearly an order of magnitude lower than they would be in bulk semiconductor devices. High voltage (and therefore high power consumption), and large areas are utilized for the TFTs, and the TFTs exhibit limited performance. TFTs thus have limited commercial application and currently are utilized primarily for large area electronics.

Various efforts have been made to improve carrier mobility of TFTs. Some improvement is obtained for devices in which silicon is the semiconductor material by utilizing a thermal anneal for grain growth following silicon ion implantation and hydrogen passivation of grain boundaries (see, for example, Yamauchi, N. et al., "Drastically Improved Performance in Poly-Si TFTs with Channel Dimensions Comparable to Grain Size", IEDM Tech. Digest, 1989, pp. 353–356). Improvements have also been made in devices in which a combination of silicon and germanium is the semiconductor material by optimizing the germanium and hydrogen content of silicon/germanium films (see, for example, King, T. J. et al, "A Low-Temperature (<=550° C.) Silicon-Germanium MOS TFT Technology for Large-Area Electronics", IEDM Tech. Digest, 1991, pp. 567–570).

Investigations have shown that nucleation, direction of solidification, and grain growth of silicon crystals can be controlled selectively and preferentially by excimer laser annealing, as well as by lateral scanning continuous wave laser irradiation/anneal for recrystallization (see, for example, Kuriyama, H. et al., "High Mobility Poly-Si TFT by a New Excimer Laser Annealing Method for Large Area Electronics", IEDM Tech. Digest, 1991, pp. 563–566; Jeon, J. H. et al., "A New Poly-Si TFT with Selectively Doped Channel Fabricated by Novel Excimer Laser Annealing", IEDM Tech. Digest, 2000, pp. 213–216; Kim, C. H. et al., "A New High-Performance Poly-Si TFT by Simple Excimer Laser Annealing on Selectively Floating a Si Layer", IEDM Tech. Digest, 2001, pp. 753–756; Hara, A. et al, "Selective Single-Crystalline-Silicon Growth at the Pre-Defined Active Regions of TFTs on a Glass by a Scanning CW Layer Irradiation", IEDM Tech. Digest, 2000, pp. 209–212; and Hara, A. et al., "High Performance Poly-Si TFTs on a Glass by a Stable Scanning CW Laser Lateral Crystallization", IEDM Tech. Digest, 2001, pp. 747–750). Such techniques have allowed relatively defect-free large crystals to be grown, with resulting TFTs shown to exhibit carrier mobility over 300 $cm^2$/V-second.

Another technique which has shown promise for improving carrier mobility is metal-induced lateral recrystallization (MILC), which can be utilized in conjunction with an appropriate high temperature anneal (see, for example, Jagar, S. et al., "Single Grain TFT with SOI CMOS Performance Formed by Metal-Induced-Lateral-Crystallization", IEDM Tech. Digest, 1999, p. 293–296; and Gu, J. et al., "High Performance Sub-100 nm Si TFT by Pattern-Controlled Crystallization of Thin Channel Layer and High Temperature Annealing", DRC Conference Digest, 2002, pp. 49–50). A suitable post-recrystallization anneal for improving the film quality within silicon recrystallized by MILC is accomplished by exposing recrystallized material to a temperature of from about 850° C. to about 900° C. under an inert ambient (with a suitable ambient comprising, for example, $N_2$). MILC can allow nearly single crystal silicon grains to be formed in predefined amorphous-silicon islands for device channel regions. Nickel-induced-lateral-recrystallization can allow device properties to approach those of single crystal silicon.

The carrier mobility of a transistor channel region can be significantly enhanced if the channel region is made of a semiconductor material having a strained crystalline lattice (such as, for example, a silicon/germanium material having a strained lattice, or a silicon material having a strained lattice) formed over a semiconductor material having a relaxed lattice (such as, for example, a silicon/germanium material having a relaxed crystalline lattice). (See, for example, Rim, K. et al., "Strained Si NMOSFETs for High Performance CMOS Technology", VLSI Tech. Digest, 2001, p. 59–60; Cheng, Z. et al., "SiGe-On-Insulator (SGOI) Substrate Preparation and MOSFET Fabrication for Electron Mobility Evaluation" 2001 IEEE SOI Conference Digest, October 2001, pp. 13–14; Huang, L. J. et al., "Carrier Mobility Enhancement in Strained Si-on-Insulator Fabricated by Wafer Bonding", VLSI Tech. Digest, 2001, pp. 57–58; and Mizuno, T. et al., "High Performance CMOS Operation of Strained-SOI MOSFETs Using Thin Film SiGe-on-Insulator Substrate", VLSI Tech. Digest, 2002, p. 106–107.)

The terms "relaxed crystalline lattice" and "strained crystalline lattice" are utilized to refer to crystalline lattices which are within a defined lattice configuration for the semiconductor material, or perturbed from the defined lattice configuration, respectively. In applications in which the relaxed lattice material comprises silicon/germanium having a germanium concentration of from 10% to 60%, mobility enhancements of 110% for electrons and 60–80% for holes can be accomplished by utilizing a strained lattice material in combination with the relaxed lattice material (see for example, Rim, K. et al., "Characteristics and Device Design of Sub-100 nm Strained SiN and PMOSFETs", VLSI Tech. Digest, 2002, 00. 98–99; and Huang, L. J. et al., "Carrier Mobility Enhancement in Strained Si-on-Insulator Fabricated by Wafer Bonding", VLSI Tech. Digest, 2001, pp. 57–58).

Performance enhancements of standard field effect transistor devices are becoming limited with progressive lithographic scaling in conventional applications. Accordingly, strained-lattice-channeled-field effect transistors on relaxed silicon/germanium offers an opportunity to enhance device performance beyond that achieved through conventional lithographic scaling. IBM recently announced the world's fastest communications chip following the approach of utilizing a strained crystalline lattice over a relaxed crystalline lattice (see, for example, "IBM Builds World's Fastest Communications Microchip", Reuters U.S. Company News, Feb. 25, 2002; and Markoff, J., "IBM Circuits are Now Faster and Reduce Use of Power", The New York Times, Feb. 25, 2002).

Although various techniques have been developed for substantially controlling nucleation and grain growth processes of semiconductor materials, grain orientation control is lacking. Further, the post-anneal treatment utilized in conjunction with MILC can be unsuitable in applications in which a low thermal budget is desired. Among the advantages of the invention described below is that such can allow substantial control of crystal grain orientation within a semiconductor material, while lowering thermal budget requirements relative to conventional methods. Additionally, the quality of the grown crystal formed from a semiconductor material can be improved relative to that of conventional methods.

In further aspects of the prior art, known dynamic random access memory (DRAM) devices include a switching transistor and an integrated storage capacitor tied to the storage node of the transistor. Incorporating a stacked capacitor or a trench capacitor in parallel with the depletion capacitance of the floating storage node enhances charge storage. Due to a finite charge leakage across the depletion layer, the capacitor is frequently recharged or refreshed to ensure data integrity in the DRAM device. Thus, such a DRAM device is volatile. A power failure causes permanent data loss in a DRAM device. DRAM devices are relatively inexpensive, power efficient, and fast compared to non-volatile random access memory (NVRAM) devices.

A minimum capacitance per cell is required to sense a conventional DRAM cell. A significant challenge for every succeeding generation of reduced feature size is to provide this minimum capacitance per cell. A memory cell design goal is to achieve an $8F^2$ DRAM cell. To that end, complex three-dimensional capacitor structures have been designed. However, these complex three-dimensional capacitor structures are difficult to manufacture and adversely impact yield. There has been serious concern of the scalability of the conventional DRAM cell beyond the 0.1 µm lithographic generation. The scaling problems have been aggravated by increased device short channel effects and leakages associated with complicated capacitor structures. Thus, the elimination of the stacked capacitor or trench capacitor in a DRAM cell is desirable.

A silicon-on-insulator (SOI) capacitor-less single-transistor DRAM cell has been proposed by S. Okhonin et al. The state of the floating body charge in the transistor affects the channel conductance of the transistor and defines the memory state ("1" or "0") of the cell. Two methods for generating carriers in the body were proposed. The generated carriers are holes for the partially depleted (PD) SOI-NFET or electrons for the PD-SOI-PFET. One proposed method generates carriers using the drain-edge high field effect associated with impact ionization. In another case, the carriers are generated by the parasitic bipolar phenomenon.

The memory retention for these SOI capacitor-less single-transistor DRAM cells depends on the device channel length. That is, the stored charge retention time decreases with decreasing channel length. Additionally, the memory retention depends on charge recombination time constants and multiple recombination mechanisms, and thus is expected to be both temperature and process sensitive. Therefore, controlling the memory retention between refresh operations is expected to be difficult.

Known non-volatile random access memory (NVRAM), such as Flash, EPROM, EEPROM, etc., store charge using a floating gate or a floating plate. Charge trapping centers and associated potential wells are created by forming nano-particles of metals or semiconductors in a large band gap insulating matrix, or by forming nano-layers of metal, semiconductor or a small band gap insulator that interface with one or more large band gap insulating layers. The floating plate or gate can be formed as an integral part of the gate insulator stack of the switching transistor.

Field emission across the surrounding insulator causes the stored charge to leak. The stored charge leakage from the floating plate or floating gate is negligible for non-volatile memory devices because of the high band gap insulator. For example, silicon dioxide ($SiO_2$) has a 9 ev band gap, and oxide-nitride-oxide (ONO) and other insulators have a band gap in the range of 4.5 ev to 9 ev. Thus, the memory device retains stored data throughout a device's lifetime.

However, there are problems associated with NVRAM devices. The writing process, also referred to as "write-erase programming," for non-volatile memory is slow and energy inefficient, and requires complex high voltage circuitry for generating and routing high voltage. Additionally, the write-erase programming for non-volatile memory involves high-field phenomena (hot carrier or field emission) that degrades the surrounding insulator. The degradation of the insulator eventually causes significant leakage of the stored charge. Thus, the high-field phenomena negatively affects the endurance (the number of write/erase cycles) of the NVRAM devices. The number of cycles of writing and erasing is typically limited to 1E6 cycles. Therefore, the available applications for these known NVRAM devices is limited.

Floating plate non-volatile memory devices have been designed that use a gate insulator stack with silicon-rich insulators. In these devices, injected charges (electrons or holes) are trapped and retained in local quantum wells provided by nano-particles of silicon embedded in a matrix of a high band gap insulator (also referred to as a "trapless" or "limited trap" insulator) such as silicon dioxide ($SiO_2$) or silicon nitride ($Si_3N_4$). In addition to silicon trapping centers, other trapping centers include tungsten particles embedded in $SiO_2$, gold particles embedded in $SiO_2$, and a tungsten oxide layer embedded in $SiO_2$.

It would be desired to provide dense and high speed capacitor-less memory cells with data non-volatility similar to Flash devices, and yet having DRAM-like endurance.

SUMMARY OF THE INVENTION

In one aspect, the invention includes a field effect transistor. The transistor comprises a gate over a body region. The body region comprises a channel region between a pair of diffusion regions, and extends into a crystalline material containing silicon and germanium. The transistor also includes a charge trapping region within the body region. In particular aspects, the charge trapping region is entirely contained within the crystalline material.

In one aspect, the invention includes a semiconductor-on-insulator field effect transistor (SOI-FET) construction. The construction includes a first crystalline layer over an electrically insulative material, with the first crystalline layer having a relaxed crystalline lattice. The construction also includes a second crystalline layer over the first crystalline layer, with the second crystalline layer having a strained crystalline lattice. A gate is over the second crystalline layer, and a body region extends into the first and second crystalline layers proximate the gate. The body region includes a pair of diffusion regions gatedly connected with one another by the gate. The body region also includes a silicon-rich-insulator (SRI) layer. In particular aspects, the body region within the first crystalline layer is entirely within a single crystal of the first crystalline layer. The SOI-FET has a first threshold voltage associated with a non-volatile first memory state when excess charges are trapped in the SRI layer, and a second threshold voltage associated with a second memory state when trapped charges in the SRI layer are neutralized.

In one aspect, the invention includes an electronic device. The device comprises a memory array. The memory array is over a substrate and includes a crystalline Si/Ge layer, and a number of memory cells associated with the crystalline Si/Ge layer. The memory cells can be organized in a number of rows and a number of columns. At least some of the memory cells include transistors containing floating body regions extending into the crystalline Si/Ge layer. The body regions contain charge trapping regions. The electronic device also includes control circuitry operably connected to the memory array to write selected memory cells and to read selected memory cells.

In one aspect, a memory comprising a plurality of the above-described devices is fabricated over a versatile base substrate, such as, for example, glass, alumina, silicon, silicon dioxide, metal and/or plastic. A thin conductive overlayer is provided on the substrate, and oxide isolation is used to isolate the memory array.

BRIEF DESCRIPTION OF THE DRAWINGS

Preferred embodiments of the invention are described below with reference to the following accompanying drawings.

FIG. 14 illustrates electrical waveforms associated with reading a memory state "1" and a memory state "0" according to various embodiments of the present subject matter.

FIG. 17 illustrates electrical waveforms associated with writing and erasing a memory cell in a FET mode of operation according to various embodiments of the present subject matter.

FIG. 21 illustrates electrical waveforms associated with writing and erasing a memory cell in a parasitic bipolar mode of operation according to various embodiments of the present subject matter.

FIG. 26 is a graph showing flatband shift versus time at an applied field of $4 \times 10^6$ volts/cm for silicon-rich silicon nitride films having varying percentages of excess silicon.

FIG. 27 is a graph showing flatband shift versus time at an applied field of $7 \times 10^6$ volts/cm for silicon-rich silicon nitride films having varying percentages of excess silicon.

FIG. 28 is a graph showing apparent dielectric constant K versus refractive index for both Silicon Rich Nitride (SRN) and Silicon Rich Oxide (SRO).

DETAILED DESCRIPTION OF THE PREFERRED EMBODIMENTS

The invention pertains to memory devices less volatile than conventional DRAM, and in particular aspects pertains to non-volatile memory devices. In various aspects, the invention pertains to incorporation of active regions of partially-depleted SOI field effect transistor (PD-SOI-FET) devices within Si/Ge materials, and in further aspects the invention encompasses incorporation of non-volatile memory devices in SOI constructions utilizing Si/Ge as a semiconductor material. Exemplary PD-SOI-FET devices are described with reference to FIGS. 10–28. Prior to the discussion of the exemplary PD-SOI-FET devices, a processing sequence for forming and utilizing preferred Si/Ge materials is described with reference to FIGS. 1–9, with particular aspects of the invention comprising forming a PD-SOI body over any versatile substrate base, including, for example, glass, metal, plastic semiconductive materials, alumina, silicon dioxide, etc.

Figure 1:
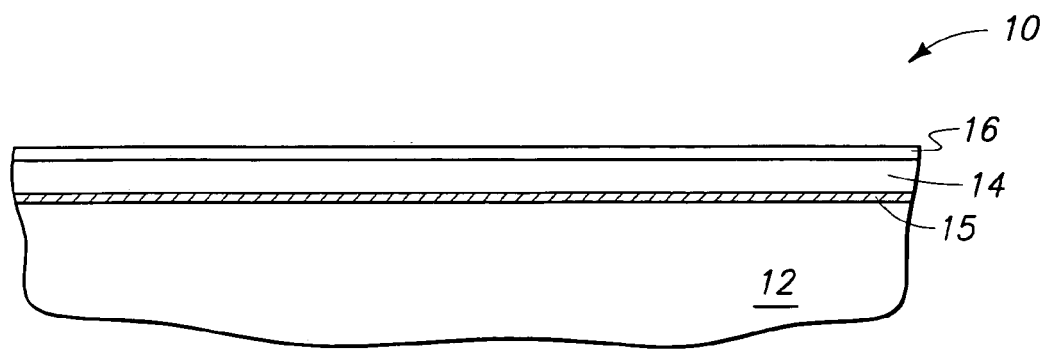
FIG. 1 is a diagrammatic, cross-sectional view of a fragment of a semiconductor construction shown at a preliminary stage of an exemplary process of the present invention.

Referring to FIG. 1, a fragment of a semiconductor construction 10 is illustrated at a preliminary processing stage. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Construction 10 comprises a base (or substrate) 12 and an insulator layer 14 over the base. Base 12 can comprise, for example, one or more of glass, aluminum oxide, silicon dioxide, metal and plastic. Additionally, and/or alternatively, base 12 can comprise a semiconductor material, such as, for example, a silicon wafer.

Layer 14 comprises an electrically insulative material, and in particular applications can comprise, consist essentially of, or consist of silicon dioxide. Layer 14 can have a thickness of, for example, from about 200 nanometers to about 500 nanometers, and can be referred to as a buffer layer.

Insulator layer 14 can be in physical contact with base 12, or can be separated from base 12 by one or more intervening materials. In the shown embodiment, a conductive material 15 is provided between base 12 and insulator 14. Conductive material 15 can comprise any suitable thermally stable conductive material, and can be referred to as a conductive overlayer. In particular aspects, material 15 comprises a high temperature metal film (for example, a film comprising, consisting essentially of, or consisting of one or both of tungsten and nickel) and/or comprises a film of conductively-doped semiconductive material (with exemplary semiconductive materials being Si, Ge and GaAs). Although material 15 is shown in FIG. 1, it is to be understood that conductive material 15 can be optional in various aspects of this disclosure. Accordingly, the conductive material 15 is not shown in the processing of FIGS. 2–9, and is shown in the processing of FIGS. 10, 11, 15B, 15D, 16B, 18A, 19B, 19D and 20B. In particular aspects, substrate 12 can comprises can electrically insulative mass and layer 15 can be formed over and physically against the mass. Also, layer 14 can be formed physically against layer 15.

Layer 14 preferably has a planarized upper surface. The planarized upper surface can be formed by, for example, chemical-mechanical polishing.

A layer 16 of semiconductive material is provided over insulator layer 14. In the shown embodiment, semiconductive material layer 16 is formed in physical contact with insulator 14. Layer 16 can have a thickness of, for example, from about 5 nanometers to about 10 nanometers. Layer 16 can, for example, comprise, consist essentially of, or consist of either doped or undoped silicon. If layer 16 comprises, consists essentially of, or consists of doped silicon, the dopant concentration can be from about $10^{14}$ atoms/cm$^3$ to about $10^{20}$ atoms/cm$^3$. The dopant can be either n-type or p-type, or a combination of n-type and p-type.

The silicon utilized in layer 16 can be either polycrystalline silicon or amorphous silicon at the processing stage of FIG. 1. It can be advantageous to utilize amorphous silicon in that it is typically easier to deposit a uniform layer of amorphous silicon than to deposit a uniform layer of polycrystalline silicon.

Figure 2:
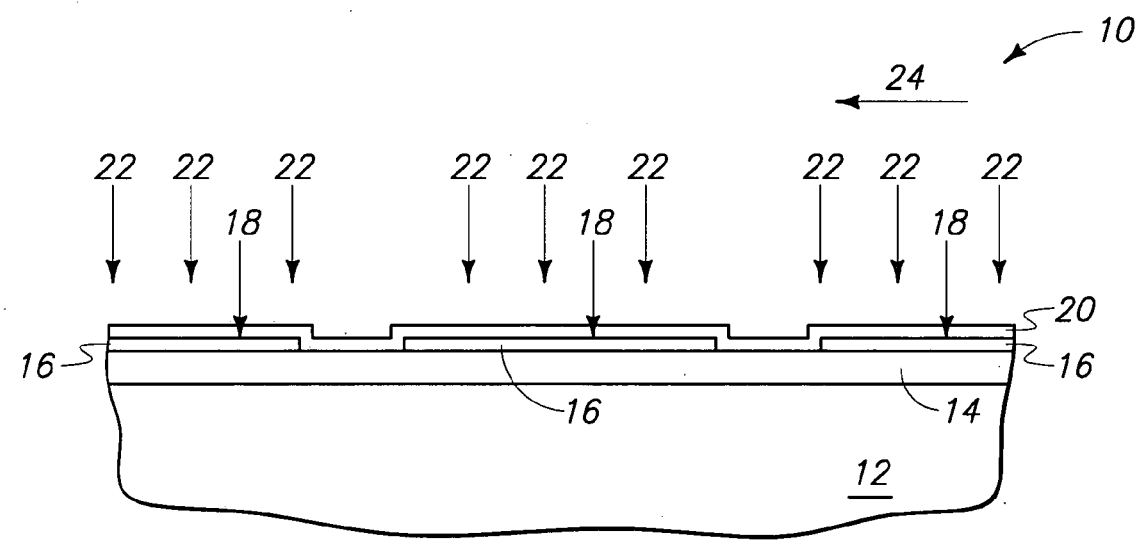
FIG. 2 is a view of the FIG. 1 fragment shown at a processing stage subsequent to that of FIG. 1.

Referring to FIG. 2, material 16 is patterned into a plurality of discrete islands (or blocks) 18. Such can be accomplished utilizing, for example, photoresist (not shown) and photolithographic processing, together with an appropriate etch of material 16.

A capping layer 20 is provided over islands 18 and over portions of layer 14 exposed between the islands. Layer 20 can, for example, comprise, consist essentially of, or consist of one or both of silicon dioxide and silicon. Layer 20 can also comprise multiple layers of silicon dioxide, stress-free silicon oxynitride, and silicon.

After formation of capping layer 20, small voids (nanovoids) and small crystals are formed in the islands 18. The formation of the voids and crystals can be accomplished by ion implanting helium 22 into material 16 and subsequently exposing material 16 to laser-emitted electromagnetic radiation. The helium can aid in formation of the nanovoids; and the nanovoids can in turn aid in crystallization and stress relief within the material 16 during exposure to the electromagnetic radiation. The helium can thus allow crystallization to occur at lower thermal budgets than can be achieved without the helium implantation. The helium is preferably implanted selectively into islands 18 and not into regions between the islands. The exposure of construction 10 to electromagnetic radiation can comprise subjecting the construction to scanned continuous wave laser irradiation while the construction is held at an appropriate elevated temperature (typically from about 300° C. to about 450° C.). The exposure to the electromagnetic radiation can complete formation of single crystal seeds within islands 18. The laser irradiation is scanned along an axis 24 in the exemplary shown embodiment.

The capping layer 20 discussed previously is optional, but can beneficially assist in retaining helium within islands 18 and/or preventing undesirable impurity contamination during the treatment with the laser irradiation.

Figure 3:
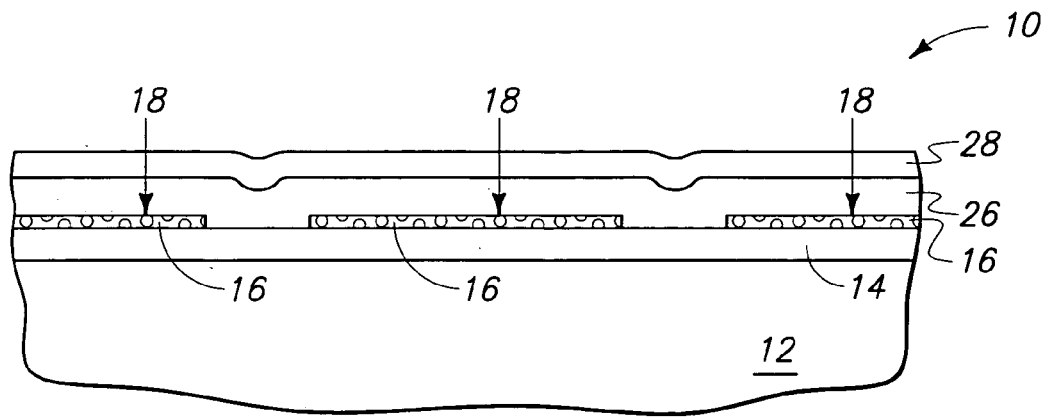
FIG. 3 is a view of the FIG. 1 fragment shown at a processing stage subsequent to that of FIG. 2.

Referring to FIG. 3, islands 18 are illustrated after voids have been formed therein. Additionally, small crystals (not shown) have also been formed within islands 18 as discussed above.

Capping layer 20 (FIG. 2) is removed, and subsequently a layer 26 of semiconductive material is formed over islands 18. Layer 26 can comprise, consist essentially of, or consist of silicon and germanium; or alternatively can comprise, consist essentially of, or consist of doped silicon/germanium. The germanium concentration within layer 26 can be, for example, from about 10 atomic percent to about 60 atomic percent. In the shown embodiment, layer 26 physically contacts islands 18, and also physically contacts insulator layer 14 in gaps between the islands. Layer 26 can be formed to a thickness of, for example, from about 50 nanometers to about 100 nanometers, and can be formed utilizing a suitable deposition method, such as, for example, plasma-assisted chemical vapor deposition.

A capping layer 28 is formed over semiconductor layer 26. Capping layer 28 can comprise, for example, silicon dioxide. Alternatively, capping layer 28 can comprise, for example, a combination of silicon dioxide and stress-free silicon oxynitride. Capping layer 28 can protect a surface of layer 26 from particles and contaminants that could otherwise fall on layer 26. If the processing of construction 10 occurs in an environment in which particle formation and/or incorporation of contaminants is unlikely (for example, an ultrahigh vacuum environment), layer 28 can be eliminated from the process. Layer 28 is utilized in the patterning of a metal (discussed below). If layer 28 is eliminated from the process, other methods besides those discussed specifically herein can be utilized for patterning the metal.

Figure 4:
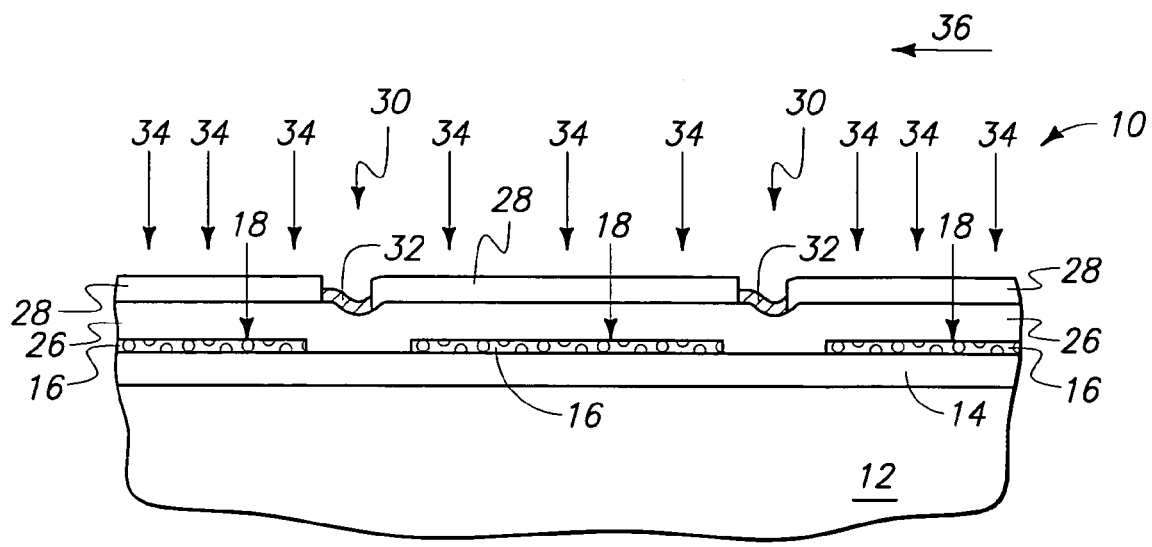
FIG. 4 is a view of the FIG. 1 fragment shown at a processing stage subsequent to that of FIG. 3.

Referring to FIG. 4, openings 30 are extended through capping layer 28 and to an upper surface of semiconductive material 26. Openings 30 can be formed by, for example, photolithographic processing to pattern a layer of photoresist (not shown) into a mask, followed by a suitable etch of layer 28 and subsequent removal of the photoresist mask.

A layer 32 of metal-containing material is provided within openings 30, and in physical contact with an upper surface of semiconductive material 26. Layer 32 can have a thickness of, for example, less than or equal to about 10 nanometers. The material of layer 32 can comprise, consist essentially of, or consist of, for example, nickel. Layer 32 can be formed by, for example, physical vapor deposition. Layer 32 can be formed to be within openings 30 and not over material 28 (as is illustrated in FIG. 4) by utilizing deposition conditions which selectively form metal-containing layer 32 on a surface of material 26 relative to a surface of material 28. Alternatively, material 32 can be deposited by a substantially non-selective process to form the material 32 over the surface of material 28 as well as over the surface of material 26 within openings 30, and subsequently material 32 can be selectively removed from over surfaces of material 28 while remaining within openings 30. Such selective removal can be accomplished by, for example, chemical-mechanical polishing, and/or by forming a photoresist mask (not shown) over the material 32 within openings 30, while leaving other portions of material 32 exposed, and subsequently removing such other portions to leave only the segments of material 32 within openings 30. The photoresist mask can then be removed.

Oxygen 34 is ion implanted through layers 26 and 28, and into layer 16 to oxidize the material of layer 16. For instance, if layer 16 consists of silicon, the oxygen can convert the silicon to silicon dioxide. Such swells the material of layer 16, and accordingly fills the nanovoids that had been formed earlier. The oxygen preferably only partially oxidizes layer 16, with the oxidation being sufficient to fill all, or at least substantially all, of the nanovoids; but leaving at least some of the seed crystals within layer 16 that had been formed with the laser irradiation discussed previously. In some aspects, the oxidation can convert a lower portion of material 16 to silicon dioxide while leaving an upper portion of material 16 as non-oxidized silicon.

The oxygen ion utilized as implant 34 can comprise, for example, oxygen ($O_2$) or ozone ($O_3$). The oxygen ion implant can occur before or after formation of openings 30 and provision of metal-containing layer 32.

Construction 10 is exposed to continuous wave laser irradiation while being held at an appropriate temperature (which can be, for example, from about 300° C. to about 450° C.; or in particular applications can be greater than or equal to 550° C.) to cause transformation of at least some of layer 26 to a crystalline form. The exposure to the laser irradiation comprises exposing the material of construction 10 to laser-emitted electromagnetic radiation scanned along a shown axis 36. Preferably, the axis 36 along which the laser irradiation is scanned is the same axis that was utilized for scanning of laser irradiation in the processing stage of FIG. 2.

The crystallization of material 26 (which can also be referred to as a recrystallization of the material) is induced utilizing metal-containing layer 32, and accordingly corresponds to an application of MILC. The MILC transforms material 26 to a crystalline form and the seed layer provides the crystallographic orientation while undergoing partial oxidation.

The crystal orientation within crystallized layer 26 can originate from the crystals initially formed in islands 18. Accordingly, crystal orientations formed within layer 26 can be controlled through control of the crystal orientations formed within the semiconductive material 16 of islands 18.

The oxidation of part of material 16 which was described previously can occur simultaneously with the MILC arising from continuous wave laser irradiation. Partial oxidation of seed layer 16 facilitates: (1) Ge enrichment into Si—Ge layer 26 (which improves carrier mobility); (2) stress-relief of Si—Ge layer 26; and (3) enhancement of recrystallization of Si—Ge layer 26. The crystallization of material 26 can be followed by an anneal of material 26 at a temperature of, for example, about 900° C. for a time of about 30 minutes, or by an appropriate rapid thermal anneal, to further ensure relaxed, defect-free crystallization of material 26. The annealing option can be dependent on the thermal stability of the material selected for substrate 12.

Figure 5:
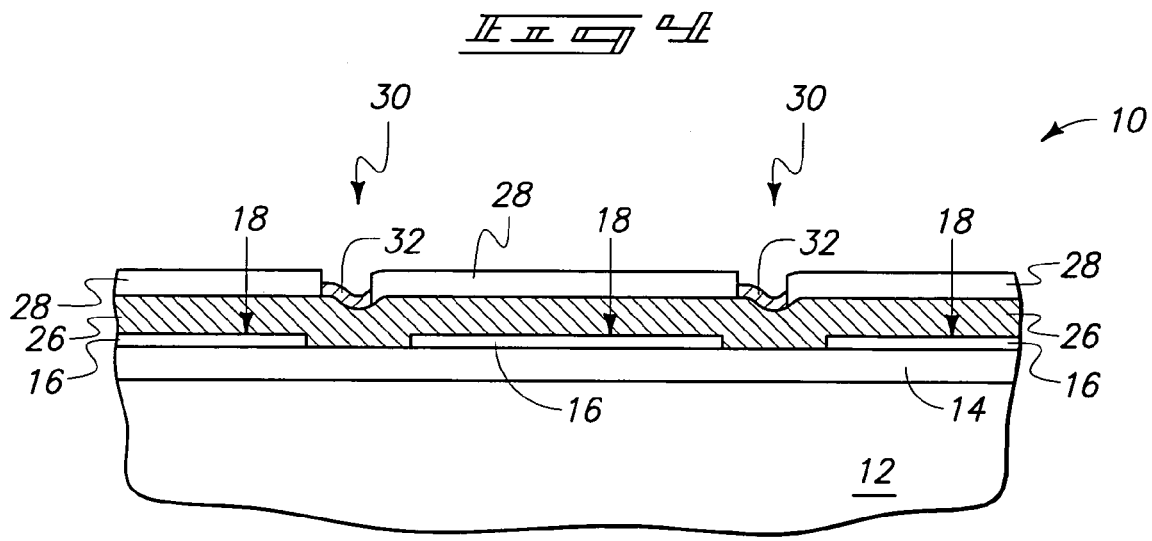
FIG. 5 is a view of the FIG. 1 fragment shown at a processing stage subsequent to that of FIG. 4.

FIG. 5 shows construction 10 after the processing described above with reference to FIG. 4. Specifically, the voids that had been in material 16 are absent due to the oxidation of material 16. Also, semiconductive material 26 has been transformed into a crystalline material (illustrated diagrammatically by the cross-hatching of material 26 in FIG. 5). Crystalline material 26 can consist of a single large crystal, and accordingly can be monocrystalline. Alternatively, crystalline material 26 can be polycrystalline. If crystalline material 26 is polycrystalline, the crystals of the material will preferably be equal in size or larger than the blocks 18. In particular aspects, each crystal of the polycrystalline material can be about as large as one of the shown islands 18. Accordingly, the islands can be associated in a one-to-one correspondence with crystals of the polycrystalline material.

The shown metal layers 32 are effectively in a one-to-one relationship with islands 18, and such one-to-one correspondence of crystals to islands can occur during the MILC. Specifically, single crystals can be generated relative to each of islands 18 during the MILC process described with reference to FIG. 4. It is also noted, however, that although the metal layers 32 are shown in a one-to-one relationship with the islands in the cross-sectional views of FIGS. 4 and 5, the construction 10 comprising the shown fragment should be understood to extend three dimensionally. Accordingly, the islands 18 and metal layers 32 can extend in directions corresponding to locations into and out of the page relative to the shown cross-sectional view. There can be regions of the construction which are not shown where a metal layer overlaps with additional islands besides the shown islands.

Figure 6:
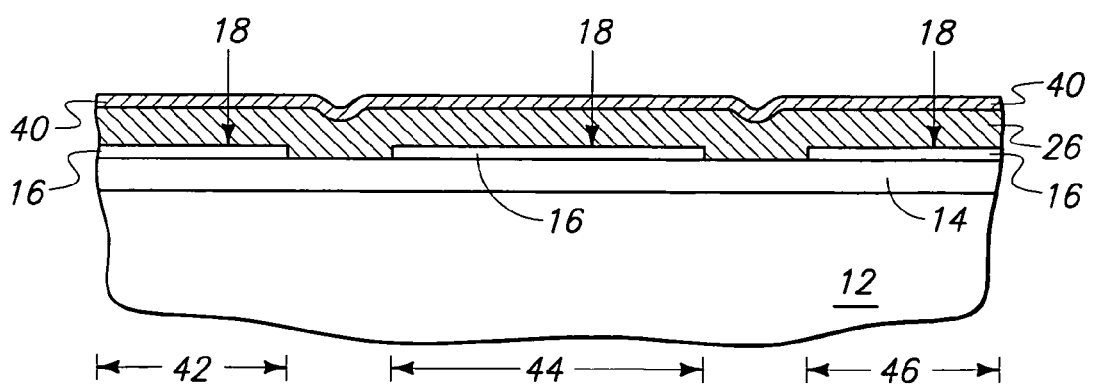
FIG. 6 is a view of the FIG. 1 fragment shown at a processing stage subsequent to that of FIG. 5.

Referring to FIG. 6, layers 28 and 32 (FIG. 5) are removed, and subsequently a layer 40 of crystalline semiconductive material is formed over layer 26. In typical applications, layer 26 will have a relaxed crystalline lattice and layer 40 will have a strained crystalline lattice. As discussed previously, layer 26 will typically comprise both silicon and germanium, with the germanium being present to a concentration of from about 10 atomic percent to about 60 atomic percent. Layer 40 can comprise, consist essentially of, or consist of either doped or undoped silicon; or alternatively can comprise, consist essentially of, or consist of either doped or undoped silicon/germanium. If layer 40 comprises silicon/germanium, the germanium content can be from about 10 atomic percent to about 60 atomic percent.

Strained lattice layer 40 can be formed by utilizing methods similar to those described in, for example, Huang, L. J. et al., "Carrier Mobility Enhancement in Strained Si-on-Insulator Fabricated by Wafer Bonding", VLSI Tech. Digest, 2001, pp. 57–58; and Cheng, Z. et al., "SiGe-On-Insulator (SGOI) Substrate Preparation and MOSFET Fabrication for Electron Mobility Evaluation" 2001 IEEE SOI Conference Digest, October 2001, pp. 13–14.

Strained lattice layer 40 can be large polycrystalline or monocrystalline. If strained lattice layer 40 is polycrystalline, the crystals of layer 40 can be large and in a one-to-one relationship with the large crystals of a polycrystalline relaxed crystalline layer 26. Strained lattice layer 40 is preferably monocrystalline over the individual blocks 18.

The strained crystalline lattice of layer 40 can improve mobility of carriers relative to the material 26 having a relaxed crystalline lattice. However, it is to be understood that layer 40 is optional in various aspects of the invention.

Each of islands 18 can be considered to be associated with a separate active region 42, 44 and 46. The active regions can be separated from one another by insulative material subsequently formed through layers 26 and 40 (not shown). For instance, a trenched isolation region can be formed through layers 26 and 40 by initially forming a trench extending through layers 26 and 40 to insulative material 14, and subsequently filling the trench with an appropriate insulative material such as, for example, silicon dioxide.

As discussed previously, crystalline material 26 can be a single crystal extending across an entirety of the construction 10 comprising the shown fragment, and accordingly extending across all of the shown active regions. Alternatively, crystalline material 26 can be polycrystalline. If crystalline material 26 is polycrystalline, the single crystals of the polycrystalline material will preferably be large enough so that only one single crystal extends across a given active region. In other words, active region 42 will preferably comprise a single crystal of material 26, active region 44 will comprise a single crystal of the material, and active region 46 will comprise a single crystal of the material, with the single crystals being separate and discrete relative to one another.

Figure 7:
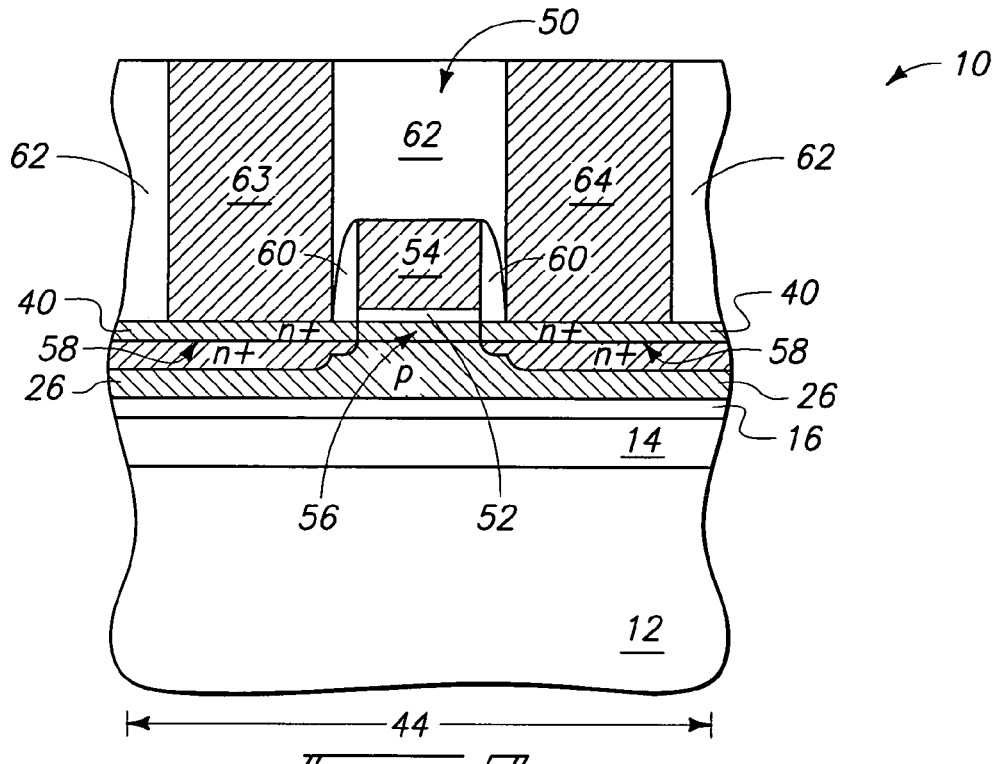
FIG. 7 is an expanded region of the FIG. 6 fragment shown at a processing stage subsequent to that of FIG. 6 in accordance with an exemplary embodiment of the present invention and shows an n-channel FET.

FIG. 7 shows an expanded view of active region 44 at a processing stage subsequent to that of FIG. 6, and specifically shows a transistor device 50 associated with active region 44 and supported by crystalline material 26.

Transistor device 50 comprises a dielectric material 52 formed over strained lattice 40, and a gate 54 formed over dielectric material 52. Dielectric material 52 typically comprises silicon dioxide, and gate 54 typically comprises a stack including an appropriate conductive material, such as, for example, conductively-doped silicon and/or metal.

A channel region 56 is beneath gate 54, and in the shown construction extends across strained crystalline lattice material 40. The channel region may also extend into relaxed crystalline lattice material 26 (as shown). Channel region 56 is doped with a p-type dopant.

Transistor construction 50 additionally comprises source/drain regions 58 which are separated from one another by channel region 56, and which are doped with n-type dopant to an n$^+$ concentration (typically, a concentration of at least $10^{21}$ atoms/cm$^3$). In the shown construction, source/drain regions 58 extend across strained lattice layer 40 and into relaxed lattice material 26. Although source/drain regions 58 are shown extending only partially through relaxed lattice layer 26, it is to be understood that the invention encompasses other embodiments (not shown) in which the source/drain regions extend all the way through relaxed material 26 and to material 16.

Channel region 56 and source/drain regions 58 can be formed by implanting the appropriate dopants into crystalline materials 26 and 40. The dopants can be activated by rapid thermal activation (RTA), which can aid in keeping the thermal budget low for fabrication of field effect transistor 50.

An active region of transistor device 50 extends across source/drain regions 58 and channel region 56. Preferably the portion of the active region within crystalline material 26 is associated with only one single crystal of material 26. Such can be accomplished by having material 26 be entirely monocrystalline. Alternatively, material 26 can be polycrystalline and comprise an individual single grain which accommodates the entire portion of the active region that is within material 26. The portion of strained lattice material 40 that is encompassed by the active region is preferably a single crystal, and can, in particular aspects, be considered an extension of the single crystal of the relaxed lattice material 26 of the active region.

Crystalline materials 40 and 26 can, together with any crystalline structures remaining in material 16, have a total thickness of less than or equal to about 2000 Å. Accordingly the crystalline material can correspond to a thin film formed over an insulative material. The insulative material can be considered to be insulative layer 14 alone, or a combination of insulative layer 14 and oxidized portions of material 16.

The transistor structure 50 of FIG. 7 corresponds to an n-type field effect transistor (NFET), and in such construction it can be advantageous to have strained crystalline material 40 consist of a strained silicon material having appropriate dopants therein. The strained silicon material can improve mobility of electrons through channel region 56, which can improve performance of the NFET device relative to a device lacking the strained silicon lattice. Although it can be preferred that strained lattice material 40 comprise silicon in an NFET device, it is to be understood that the strained lattice can also comprise other semiconductive materials. A strained silicon lattice can be formed by various methods. For instance, strained silicon could be developed by various means and lattice 40 could be created by lattice mismatch with other materials or by geometric conformal lattice straining on another substrate (mechanical stress).

As mentioned above, strained lattice 40 can comprise other materials alternatively to, or additionally to, silicon. The strained lattice can, for example, comprise a combination of silicon and germanium. There can be advantages to utilizing the strained crystalline lattice comprising silicon and germanium relative to structures lacking any strained lattice. However, it is generally most preferable if the strained lattice consists of silicon alone (or doped silicon), rather than a combination of silicon and germanium for an NFET device.

A pair of sidewall spacers 60 are shown formed along sidewalls of gate 54, and an insulative mass 62 is shown extending over gate 54 and material 40. Conductive interconnects 63 and 64 extend through the insulative mass 62 to electrically connect with source/drain regions 58. Interconnects 63 and 64 can be utilized for electrically connecting transistor construction 50 with other circuitry external to transistor construction 50. Such other circuitry can include, for example, a bitline and a capacitor in applications in which construction 50 is incorporated into dynamic random access memory (DRAM).

Figure 8:
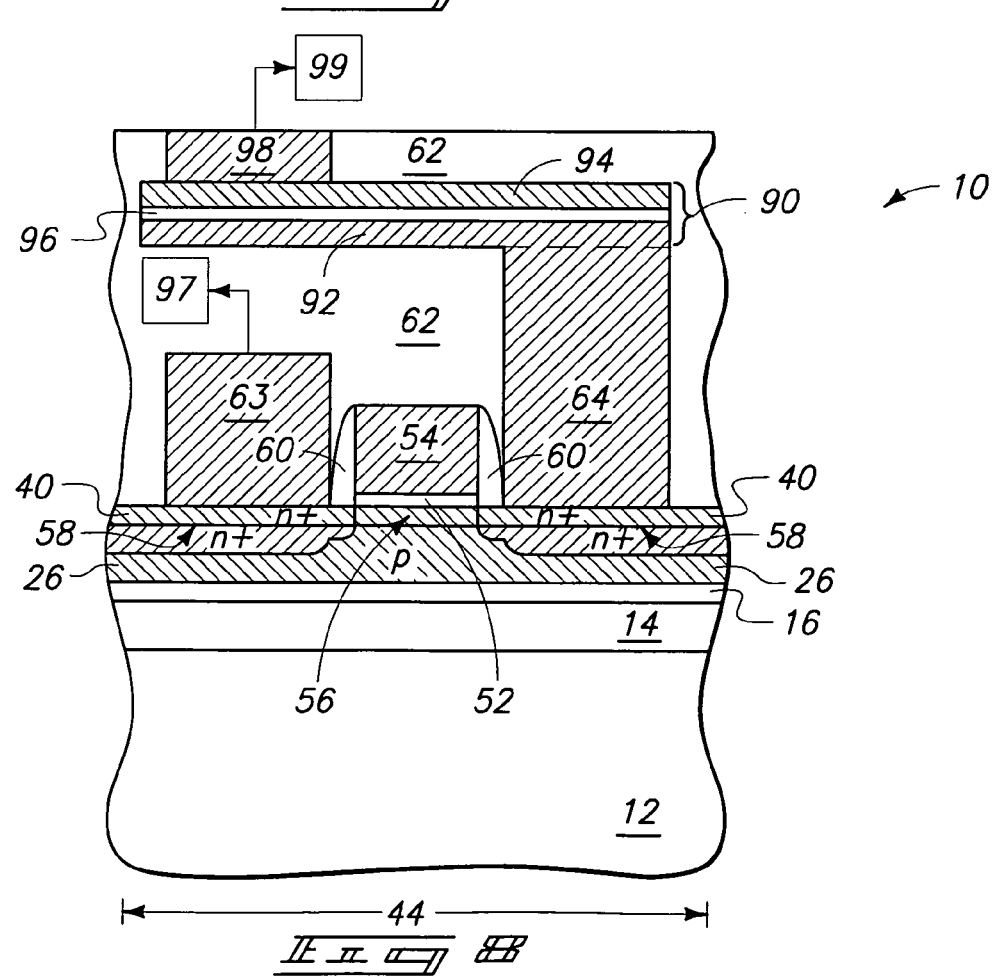
FIG. 8 is a view of the FIG. 7 fragment shown at a processing stage subsequent to that of FIG. 7.

FIG. 8 shows construction 10 at a processing stage subsequent to that of FIG. 7, and shows a capacitor structure 90 formed over and in electrical contact with conductive interconnect 64. The shown capacitor structure extends across gate 54 and interconnect 63.

Capacitor construction 90 comprises a first capacitor electrode 92, a second capacitor electrode 94, and a dielectric material 96 between capacitor electrodes 92 and 94. Capacitor electrodes 92 and 94 can comprise any appropriate conductive material, including, for example, conductively-doped silicon. In particular aspects, electrodes 92 and 94 will each comprise n-type doped silicon, such as, for example, polycrystalline silicon doped to a concentration of at least about $10^{21}$ atoms/cm$^3$ with n-type dopant. In a particular aspect of the invention, electrode 92, conductive interconnect 64 and the source/drain region 58 electrically connected with interconnect 64 comprise, or consist of, n-type doped semiconductive material. Accordingly, n-type doped semiconductive material extends from the source/drain region, through the interconnect, and through the capacitor electrode.

Dielectric material 96 can comprise any suitable material, or combination of materials. Exemplary materials suitable for dielectric 106 are high dielectric constant materials including, for example, silicon nitride, aluminum oxide, TiO$_2$, Ta$_2$O$_5$, ZrO$_2$, etc.

The conductive interconnect 63 is in electrical connection with a bitline 97. Top capacitor electrode 94 is shown in electrical connection with an interconnect 98, which in turn connects with a reference voltage 99, which can, in particular aspects, be ground. The construction of FIG. 8 can be considered a DRAM cell, and such can be incorporated into an electronic system (such as, for example, a computer system) as a memory device.

Figure 9:
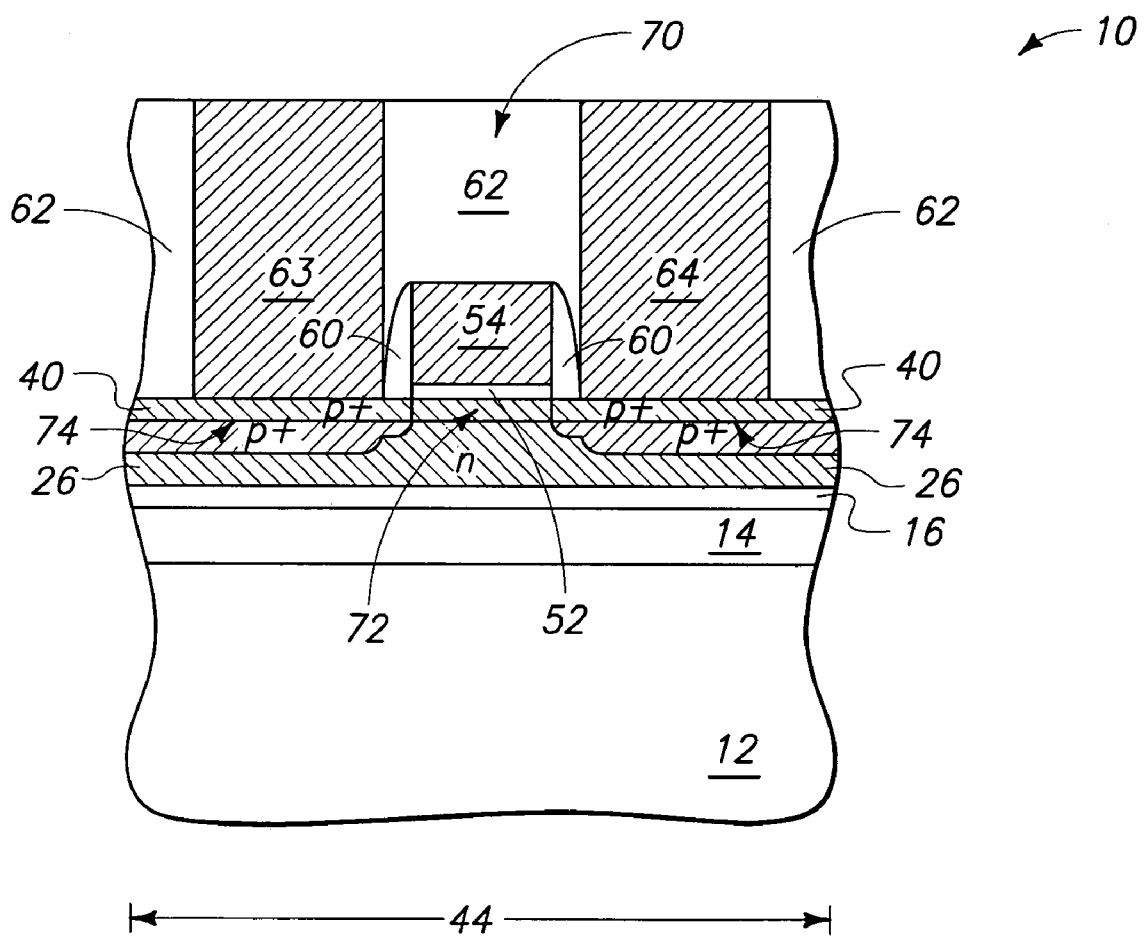
FIG. 9 is a view of an expanded region of FIG. 6 shown at a processing stage subsequent to that of FIG. 6 in accordance with an alternative embodiment relative to that of FIG. 7 and shows a p-channel FET.

FIG. 9 shows construction 10 at a processing stage subsequent to that of FIG. 6 and alternative to that described previously with reference to FIG. 7. In referring to FIG. 9, similar numbering will be used as is used above in describing FIG. 7, where appropriate.

A transistor construction 70 is shown in FIG. 9, and such construction differs from the construction 50 described above with reference to FIG. 7 in that construction 70 is a p-type field effect transistor (PFET) rather than the NFET of FIG. 7. Transistor device 70 comprises an n-type doped channel region 72 and p$^+$-doped source/drain regions 74. In other words, the channel region and source/drain regions of transistor device 70 are oppositely doped relative to the channel region and source/drain regions described above with reference to the NFET device 50 of FIG. 7.

The strained crystalline lattice material 40 of the PFET device 70 can consist of appropriately doped silicon, or consist of appropriately doped silicon/germanium. It can be most advantageous if the strained crystalline lattice material 40 comprises appropriately doped silicon/germanium in a PFET construction, in that silicon/germanium can be a more effective carrier of holes with higher mobility than is silicon without germanium.

Devices similar to the transistor devices discussed above (NFET device 50 of FIG. 7, and PFET device 70 of FIG. 9) can be utilized in numerous constructions in addition to the construction described above with reference to FIG. 8. For instance, similar devices can be utilized in partially-depleted SOI field effect transistor (PD-SOI-FET) devices.

FIGS. 10–28 illustrate exemplary one transistor memory cells which can be formed in accordance with various aspects of the present invention. The memory cells are formed using semiconductor-on-insulator (SOI) technology. In various embodiments, the memory cell transistors are PD-SOI-FET devices with a floating body that contains charge traps. However, various embodiments of the present subject matter include other floating body transistors. In various embodiments the memory cells are non-volatile.

A one transistor SOI memory cell of the present subject matter can achieve high density (4F$^2$), have fast DRAM-like read/write capabilities, and have high-retention and non-volatility. A binary yet stable memory state is provided by trapping charges in the floating body of the PD-SOI transistor, and by neutralizing (or discharging) the charges trapped in the floating body. In various embodiments, the trapped charge is neutralized by injecting charge of opposite polarity into the body. The state of the memory cell is read by sensing the channel conductance of the cell transistor to determine if the cell transistor is in a charged state or a neutralized state, which can be defined as a logic or memory state "1", and a logic or memory state "0". For example, the memory cell state is determined by sensing the change in the device current that is associated with the trapped stored-charge. An array of such cells can fabricated over a versatile range of substrate bases (for example, glass, metal, plastic, semiconductive material, alumina, silicon dioxide, etc.), and utilized as a memory device array. If the substrate has an electrically insulative surface, a conductive overlayer film can be provided over the surface of the substrate prior to forming the cells. The PD-SOI transistor bodies can then be integrated over the substrate.

The present subject matter generates carriers in a floating body of the PD-SOI transistor, and traps the carriers in the floating body using charge traps. The binary memory state is provided by trapping charges in the floating body and by neutralizing the trapped charge in the floating body. In various embodiments, the charge traps are provided by a charge trapping layer in the floating body. According to various embodiments, the charge trapping layer includes silicon-rich-nitride (SRN). The trapped carriers are neutralized by generating and injecting charges of opposite polarity.

According to various embodiments, the trapped charge state of the memory cell provides an energy barrier for the stored charge in the order of 1 ev or less. Thus, for various embodiments, the memory cell is capable of having long charge retention for both the charged state and the neutralized state. The charge retention is independent of the channel length. This long charge retention provides the memory cell with a non-volatile characteristic. The degree of non-volatility can be altered by altering the trapping material and thereby modifying the energy barrier (trapped energy depth). Therefore, various embodiments have an appropriate trapping material to provide a non-volatile read-write random access memory, and various embodiments have an appropriate trapping material to provide a non-volatile write once, read only memory.

Those of ordinary skill in the art will appreciate, upon reading and understanding this disclosure, that the present subject matter provides a number of benefits. These benefits include inexpensive and dense memories. The memory cell ($4F^2$) of the present invention is twice as dense as a conventional DRAM ($8F^2$). Another benefit is non-volatility, thus eliminating the need to refresh the state of the memory cell. Another benefit of the present subject matter is that the memory cell of the present subject matter is energy efficient. Another benefit is that the present subject matter provides DRAM-like endurance within a non-volatile memory cell because the non-volatile memory cell of the present subject matter is capable of undergoing a large number of write/erase cycles. Another benefit of the present subject matter can be to utilize low cost materials as the versatile substrate base, which can reduce costs of memory devices formed in accordance with methodology of the present invention and provide wider applicability of used for the various devices.

Memory Cell Structure

Figure 10:
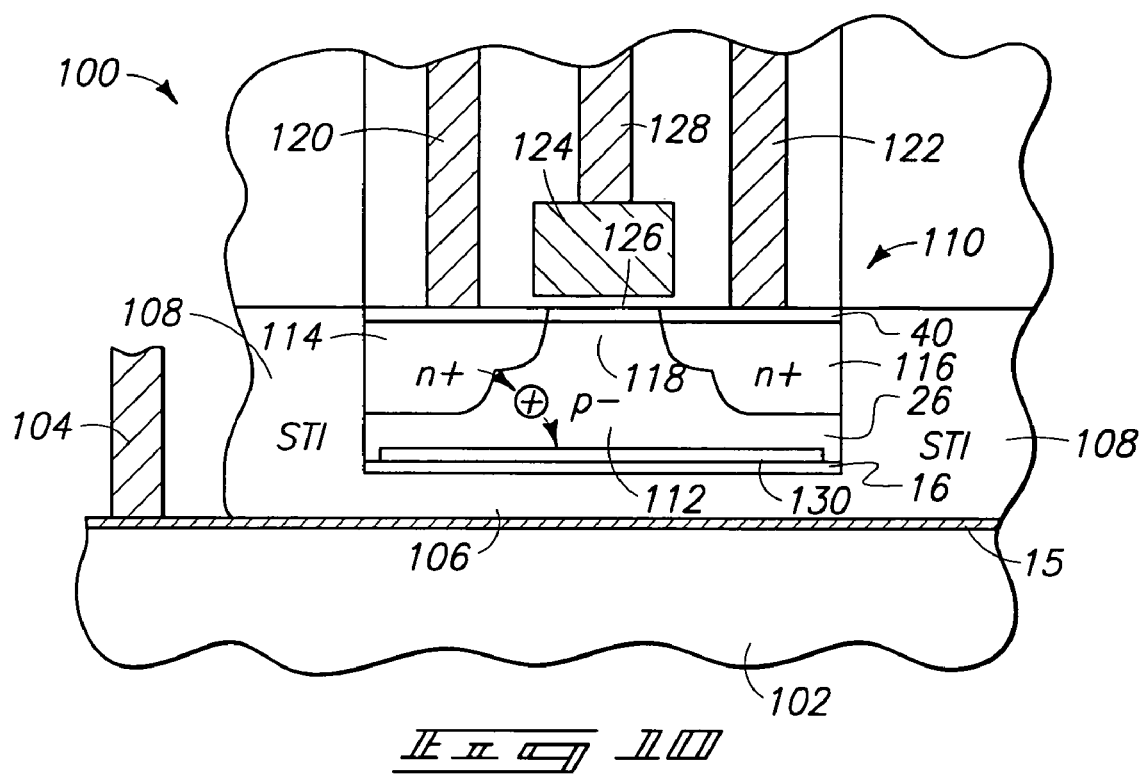
FIG. 10 illustrates an n-channel one transistor SOI non-volatile memory cell according to various embodiments of the present subject matter.

FIG. 10 illustrates an n-channel one transistor SOI non-volatile memory cell according to various embodiments of the present subject matter. Substrate 102 can comprise materials of the type described previously with respect to FIGS. 1–9, and can therefore comprise one or more of semiconductor material, glass, aluminum oxide, silicon dioxide, metal and plastic. In particular applications, substrate 102 can comprise a silicon wafer. The conductive overlayer 15 is integrated on the top surface of substrate 102. A substrate contact 104 connects with conductive material 15, and through material 15 electrically connects and couples to all memory cells. If substrate 102 comprises an electrically conductive upper surface, overlayer 15 can be omitted and contact 104 can be connected directly to the upper surface of substrate 102. Although only one contact 104 is shown, it is to be understood that there could be two or more contacts in various aspects of the invention.

The memory cell 100 is isolated from the substrate 102 via a buried insulator, such as a buried oxide (BOX) layer 106, and from other devices (now shown) via shallow trench isolation (STI) regions 108. Layer 106 can comprise the same materials as the layer 14 of FIGS. 1–9.

A PD-SOI NFET 110 is illustrated. The transistor 110 includes a floating body region 112, a first diffusion region 114, and a second diffusion region 116. A channel region 118 is formed in the body region 112 between the first and second diffusion regions 114 and 116. With respect to the illustrated n-channel FET, the body region 112 is doped with p– type impurities, and the first and second diffusion regions 114 and 116 are doped with n+ impurities. The illustrated memory cell 100 includes a bitline contact or drain contact 120 connected to the first diffusion region 114, and a source line contact 122 connected to the second diffusion region 116. A gate 124, such as a polysilicon gate, is separated from the channel region 118 by a gate insulator region 126. The illustrated memory cell 100 includes a wordline contact or gate contact 128 connected to the gate 124. The diffusion regions and body region are not shown with cross-hatching in FIG. 10 or any of the figures that follow FIG. 10 in an effort to simplify the drawings, but is to be understood that such regions would be similar to the cross-hatched diffusion and active regions described with reference to FIGS. 7–9.

Transistor 110 is formed over the layers 16, 26 and 40 described previously with respect to FIGS. 1–9. The diffusion regions (or source/drain regions) 114 and 116 extend into materials 40 and 26. Diffusion regions 114 and 116 can comprise identical constructions to those described above with reference to FIG. 7. Additionally, diffusion regions 114 and 116 can be encompassed by an active region of transistor device 110, with such active region preferably having the preferred characteristics described above with reference to FIG. 6. In other words, an entirety of the active region extending within material 26 is preferably within a single crystal of material 26, and an entirety of the active region extending within material 40 is preferably within a single crystal of material 40. Further, material 26 preferably comprises Si/Ge having a relaxed crystalline lattice, and material 40 preferably comprises one or both of Si and Ge in the form of a crystalline material having a strained crystalline lattice. Materials 26 and 40 can be either polycrystalline or monocrystalline, in accordance with aspects of the invention described above with reference to FIGS. 1–7.

Unlike conventional FET devices, the body region 112 of the illustrated FET device includes a charge trapping region 130. Relatively simple fabrication techniques can be used to incorporate the charge trapping region in the body region. However, as one of ordinary skill in the art will understand upon reading and comprehending this disclosure, the incorporation of the charge trapping region 130 significantly improves scalability and functionality without complex fabrication techniques. Charge trapping region 130 provides the nonvolatility of the memory cell.

The location of the charge trapping region 130 in the body region 112 can be varied. In various embodiments, the location the charge trapping region 130 is on or near the BOX-body interface. In other embodiments, the charge trapping region 130 is located elsewhere in the body region 112 at a sufficient depth such that it will not interfere with the transistor channel conductance. For example, various embodiments of the present subject matter position the charge trapping region 130 in the body region 112 at a depth below 200–300 Å (20–30 nm) from the surface where the charge flows. In the shown aspect of the invention, charge trapping region 130 is above an upper surface of layer 16, within Ge/Si layer 26, and below layer 40. In other words, charge trapping layer 130 is entirely contained within layer 26. It is to be understood, however, that in other aspects (not shown) charge trapping layer 130 can extend into either layer 16 or 40. Layer 130 can be entirely contained in one of layers 16 or 40, or can be contained in a combination of layers 16/26 or a combination of layers 26/40. Further, layer 130 can extend at an angle relative to surfaces of layers 16, 26 and 40 so that layer 130 may traverse all of the layers 16, 26 and 40.

The charge trapping region 130 provides localized quantum wells that are initially neutral. These neutral wells attract charges and maintain the charge species. Thus, charge traps are distinguished from recombination centers, which have been proposed in a body region to assist with the recombination of charges. Unlike the charge trapping regions, a recombination center provides a charged localized quantum well. The charged well attracts opposite charges which recombine to facilitate charge neutrality.

One of ordinary skill in the art will understand, upon reading and comprehending this disclosure, that the charge trapping region is capable of being tailored to provide the device with desired characteristics. For example, various embodiments of the present subject matter are designed to repeatedly trap and de-trap charges in the charge trapping region so as to form a non-volatile random access memory. Various embodiments provide a charge trapping region with deep traps, and are designed to form a non-volatile, write once, read only memory.

In various embodiments, the charge trapping function of the charge trapping region 130 is provided by a charge trapping layer. According to various embodiments, the charge trapping layer includes a silicon-rich-insulator (SRI) layer, such as a silicon-rich-nitride (SRN) or silicon-rich-oxide (SRO) layer, for example. SRI, SRN and SRO are described with respect to FIGS. 24–28 below in the section entitled Silicon Rich Insulators. One of ordinary skill in the art will understand, upon reading and comprehending this disclosure, that many other materials or combination of layers may be selected that provide the desired energy barriers, and thus provide the desired charge trapping characteristics.

As will be described in more detail below, positive charges (holes) are generated in the PD-SOI NFET due to impact ionization at the drain edge and alter the floating body potential. In this embodiment a part of these charges is trapped by the charge trapping region 130 (e.g. SRN layer) in the body region 112. The trapped charges affect the threshold voltage ($V_T$), and thus the channel conductance, of the PD-SOI-FET. According to various embodiments, the source current ($I_S$) of the PD-SOI-FET is used to determine if charges are trapped in the body region, and thus is used to determine the logic state of the memory cell.

Figure 11:
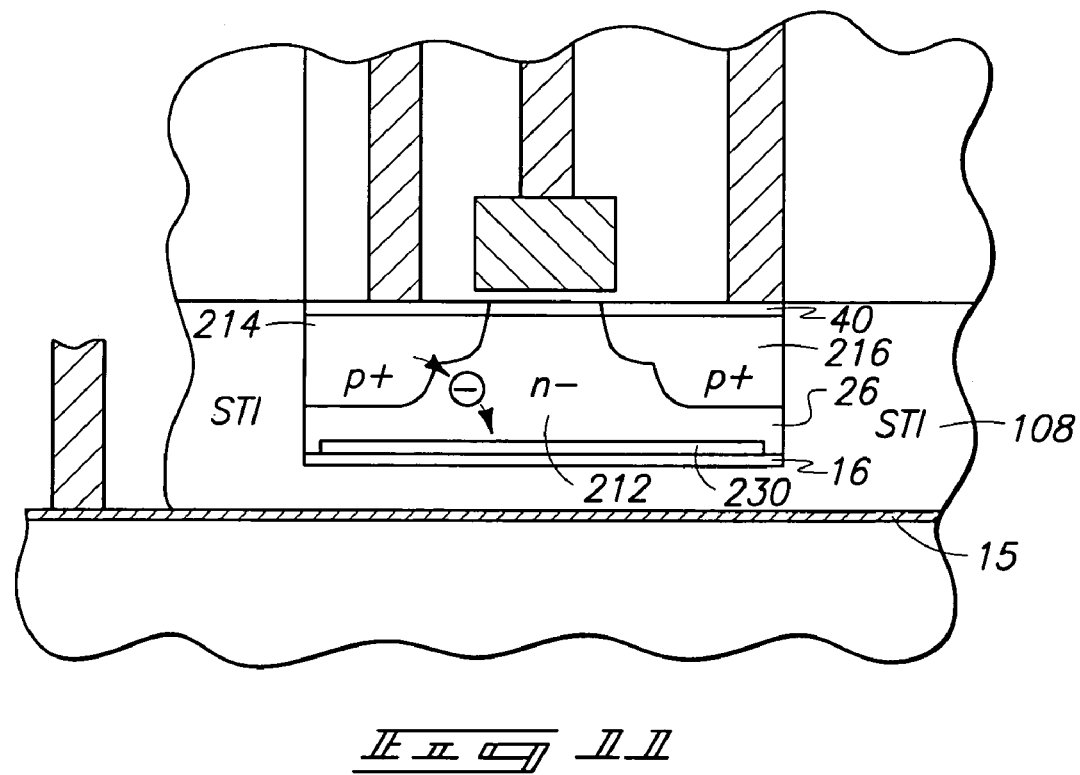
FIG. 11 illustrates a p-channel one transistor SOI non-volatile memory cell according to various embodiments of the present subject matter.

FIG. 11 illustrates a p-channel one transistor SOI non-volatile memory cell according to various embodiments of the present subject matter. One of ordinary skill in the art, upon reading and comprehending this disclosure, will understand the structural similarities between the PD-SOI-PFET device and the PD-SOI-NFET device. Some of these structural similarities are not addressed again here for the purpose of simplifying the disclosure.

With respect to the illustrated PD-SOI-PFET, the body region 212 is doped with n– type impurities, and the first and second diffusion regions 214 and 216 are doped with p+ impurities. Negative charges (electrons) are generated in the PD-SOI-PFET at the drain edge and alter the floating body potential. A part of these charges is trapped by the charge trapping region 230 (e.g. SRN layer) in the body region 212. The trapped charges affect the threshold voltage ($V_T$), and thus the channel conductance, of the PD-SOI-PFET in a similar fashion to the PD-SOI-NFET. According to various embodiments, the source current ($I_S$) of the PD-SOI-PFET is used to determine if charges are trapped in the body region, and thus is used to determine the logic state of the memory cell.

The transistor of FIG. 11 is, like that of FIG. 10, formed over the layers 16, 26 and 40 described previously. The diffusion regions (or source/drain regions) 214 and 216 extend into materials 40 and 26. Diffusion regions 214 and 216 can comprise identical constructions to those described above with reference to FIG. 9. Additionally, diffusion regions 214 and 216 can be encompassed by an active region of transistor device of FIG. 11, with such active region preferably having the preferred characteristics described above with reference to FIG. 6. In other words, an entirety of the active region extending within material 26 is preferably within a single crystal of material 26, and an entirety of the active region extending within material 40 is preferably within a single crystal of material 40. Further, material 26 preferably comprises Si/Ge having a relaxed crystalline lattice, and material 40 preferably comprises one or both of Si and Ge in the form of a crystalline material having a strained crystalline lattice. Materials 26 and 40 can be either polycrystalline or monocrystalline, in accordance with aspects of the invention described above with reference to FIGS. 1–9.

Charge trapping region 230 can be, like the above-described charge trapping layer 130, entirely contained within one of layers 16, 26 and 40; or can be contained within various combinations of layers 16, 26 and 40.

In order to simplify this disclosure, memory cells containing PD-SOI-NFET devices are illustrated and described in the discussion that follows. One of ordinary skill in the art will understand, upon reading and comprehending this disclosure, that the present subject matter is not limited to PD-SOI-NFET devices.

Figure 12:
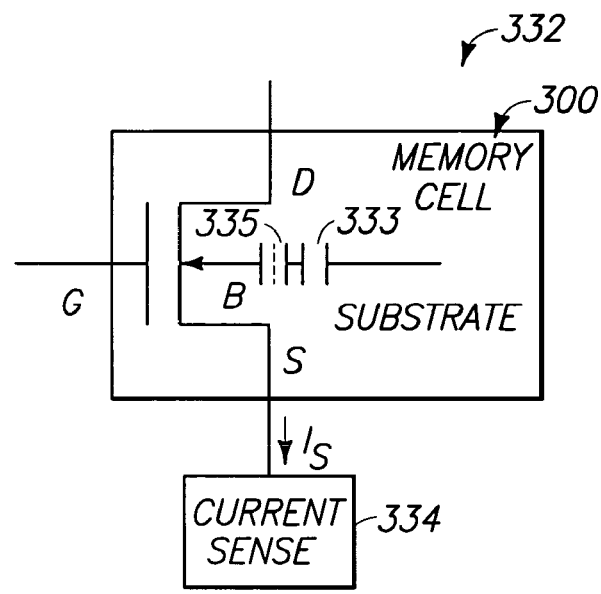
FIG. 12 illustrates a first memory read scheme according to various embodiments of the present subject matter.

FIG. 12 illustrates a first memory read scheme according to various embodiments of the present subject matter. In the illustrated system 332, the state of the cell 300 is sensed using a direct cell-current sense amplifier scheme. The memory cell 300 is connected to the current sense circuitry 334, which is used to sense the source current ($I_S$), and thus the state of the memory cell 300. The schematic of the memory cell illustrates a capacitive coupling between the substrate and the PD-SOI-NFET of the memory cell. As shown in FIG. 10, the BOX layer 106 forms a dielectric between conductive layer 15 and the body region 112. Aside from the gate-body and body substrate capacitance 333 shown in FIG. 12, an additional series capacitance 335 is associated with the charge-trapping region. The charge trapping characteristic is illustrated by dotted lines in the capacitor 335.

The direct cell-current sense amplifier scheme can be compared to the sensing schemes associated with static random access memory (SRAM). One of ordinary skill in the art will understand, upon reading and comprehending this disclosure, that the memory cell can be designed and the performance of the memory cell specified such that the direct cell-current sense amplifier scheme can be used.

Figure 13:
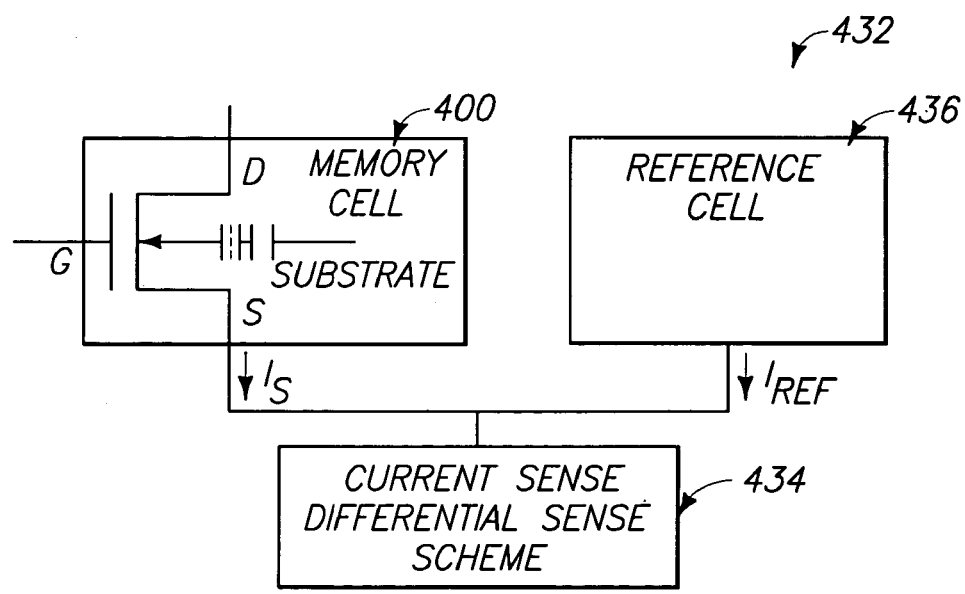
FIG. 13 illustrates a second memory read scheme according to various embodiments of the present subject matter.
Figure 11:
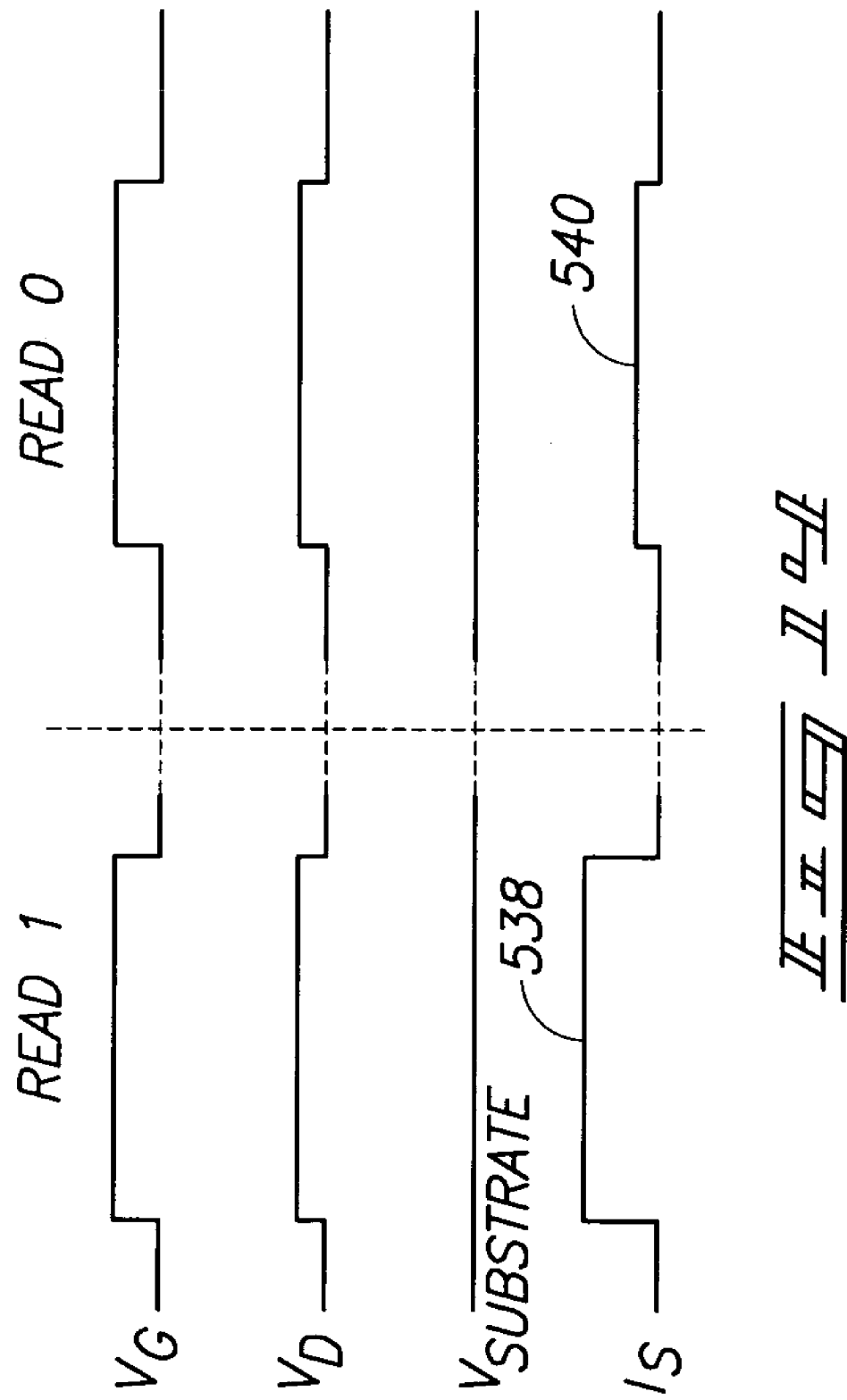

FIG. 13 illustrates a second memory read scheme according to various embodiments of the present subject matter. In the illustrated system 432, the state of the cell 400 is sensed using a reference cell 436 and a current mode differential sense amplifier scheme. This scheme can be compared to the sensing schemes associated with dynamic random access memory (DRAM). Both the memory cell 400 and the reference cell 436 are connected to the current sense circuitry 434, which is used to compare the source current ($I_S$)

of the memory cell 400 with the current ($I_{REF}$) of the reference cell 436 to determine the state of the memory cell 400.

FIG. 14 illustrates electrical waveforms associated with reading a memory state "1" and a memory state "0" according to various embodiments of the present subject matter. For the illustrated read operations, a positive gate voltage ($V_G$) and a positive drain voltage ($V_D$) are applied while the substrate voltage is held at a reference voltage (e.g. ground). One of ordinary skill in the art will understand, upon reading and comprehending this disclosure, that the terms positive and negative are relative terms with respect to the reference voltage.

When the memory cell is in a memory state "1" in which holes are stored in the charge trapping region within the floating body of the PD-SOI NFET device, the threshold of the device decreases resulting in a higher source current ($I_S$), represented generally at 538. When the memory cell is in a memory state "0" in which the stored holes are neutralized in the floating body of the PD-SOI NFET device, the threshold of the device increases, resulting in a lower source current ($I_S$) which is represented generally at 540. The difference between the source current in the memory state "1" can be two to three orders of magnitude greater than the source current in the memory state "0".

Memory Cell Operation

The one transistor SOI non-volatile memory cell of the present subject exploits the body charging associated with the excess carriers in the body (also referred to as floating body effect) of PD-SOI devices to store information. Part of the excess carriers in the floating body gets trapped and stored in the charge trapping layer in the body. This trapped stored charge in the transistor body affects the threshold voltage ($V_T$). A lower threshold voltage ($V_T$) increases the source current ($I_S$) of the transistor, and a higher threshold voltage ($V_T$) decreases the source current ($I_S$). The source current ($I_S$) of the memory cell transistor is used to determine the state of the memory cell.

There are a number of ways in which to generate the excess charge in a PD-SOI transistor. A first method for generating charge in PD-SOI transistors involves impact ionization in a field effect transistor (FET) operational mode. A second method for generating charge in PD-SOI transistors involves a relatively low field parasitic bipolar junction transistor turn-on mode. These methods for generating charge are described in detail below with respect to a memory operation embodiment for n-channel FET devices. The excess charge for the NFET devices are holes. One of ordinary skill in the art will understand, upon reading and comprehending this disclosure, how to generate complementary charge (electrons) using the high field impact ionization mode and the relatively low field parasitic bipolar transistor mode for p-channel FET devices.

FET Mode of Operation for Carrier Generation and Programming

The FET operational mode for generating charges in the body of a PD-SOI transistor involves high field impact ionization at the drain edge of the FET device. In various embodiments, the generated positive charge in the body region of the PD-SOI-NFET device is directed toward the charge traps in the body region by providing an appropriate electromotive force (EMF) field vertical (or normal) to the FET channel. The EMF field is provided by applying an appropriate voltage difference between the gate and the substrate.

Figure 15A:
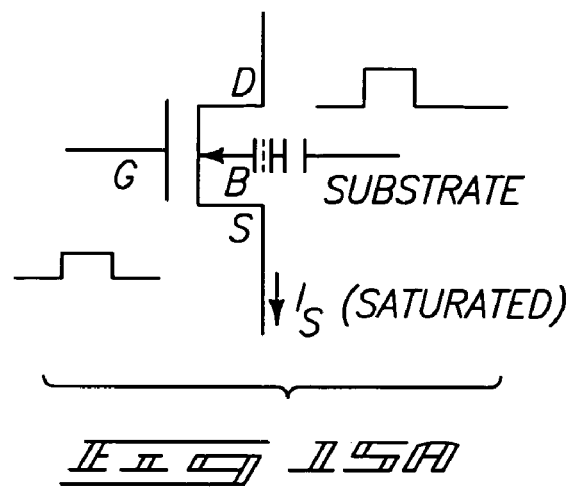
FIGS. 15A–15D illustrate a write operation for a memory cell in a FET mode of operation according to various embodiments of the present subject matter.
Figure 15B:
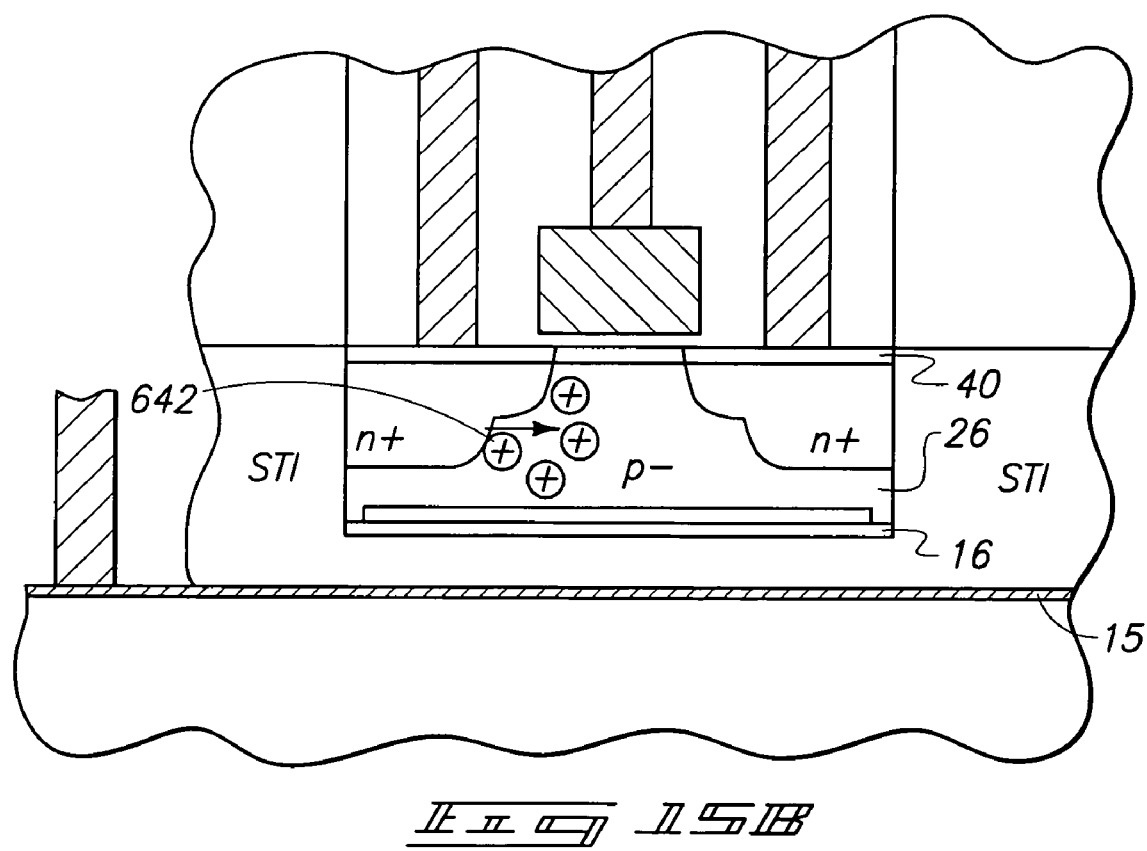
Figure 15C:
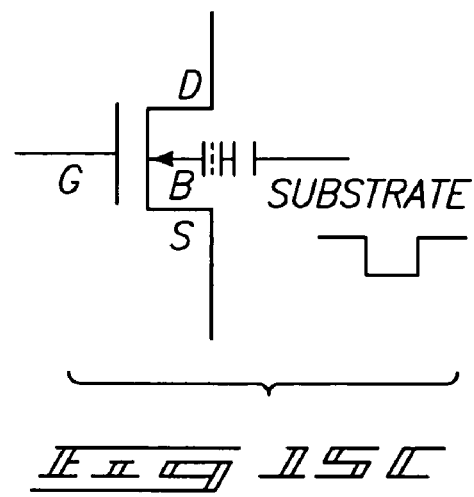
Figure 15D:
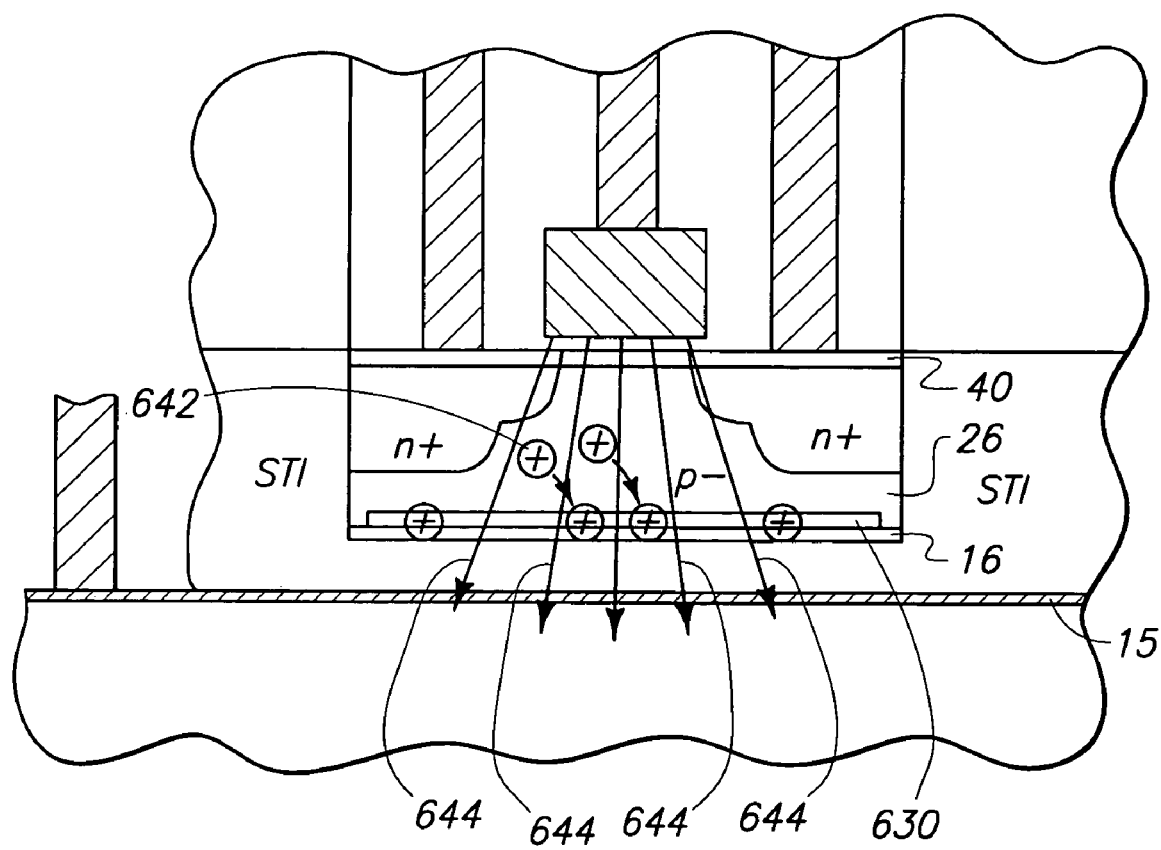

FIGS. 15A–15D illustrate a write operation for a memory cell in a FET mode of operation according to various embodiments of the present subject matter. In the FET operational mode, a high positive drain voltage pulse is applied when the wordline is held high such that the transistor operates in saturation (FIG. 15A). An excess of positive body charge 642 is created near the drain region due to the impact ionization mechanism associated with the device operation in saturation (FIG. 15B). A negative substrate voltage pulse is applied (FIG. 15C) in a timely sequence after the positive charge is generated by the impact ionization mechanism. The negative substrate voltage provides an EMF field across the body region (represented diagrammatically by 644) which causes the generated holes 642 to drift toward the charge trapping region 630 (FIG. 15D). In various embodiments, the charge trapping region 630 includes a layer of SRN near the BOX/body interface. In this state, the raised positive body potential lowers the threshold voltage ($V_T$) of the transistor.

Figure 16A:
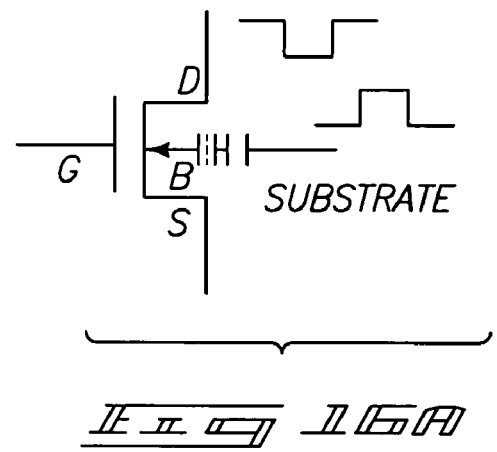
FIGS. 16A–16B illustrate an erase operation for a memory cell in a FET mode of operation according to various embodiments of the present subject matter.
Figure 16B:
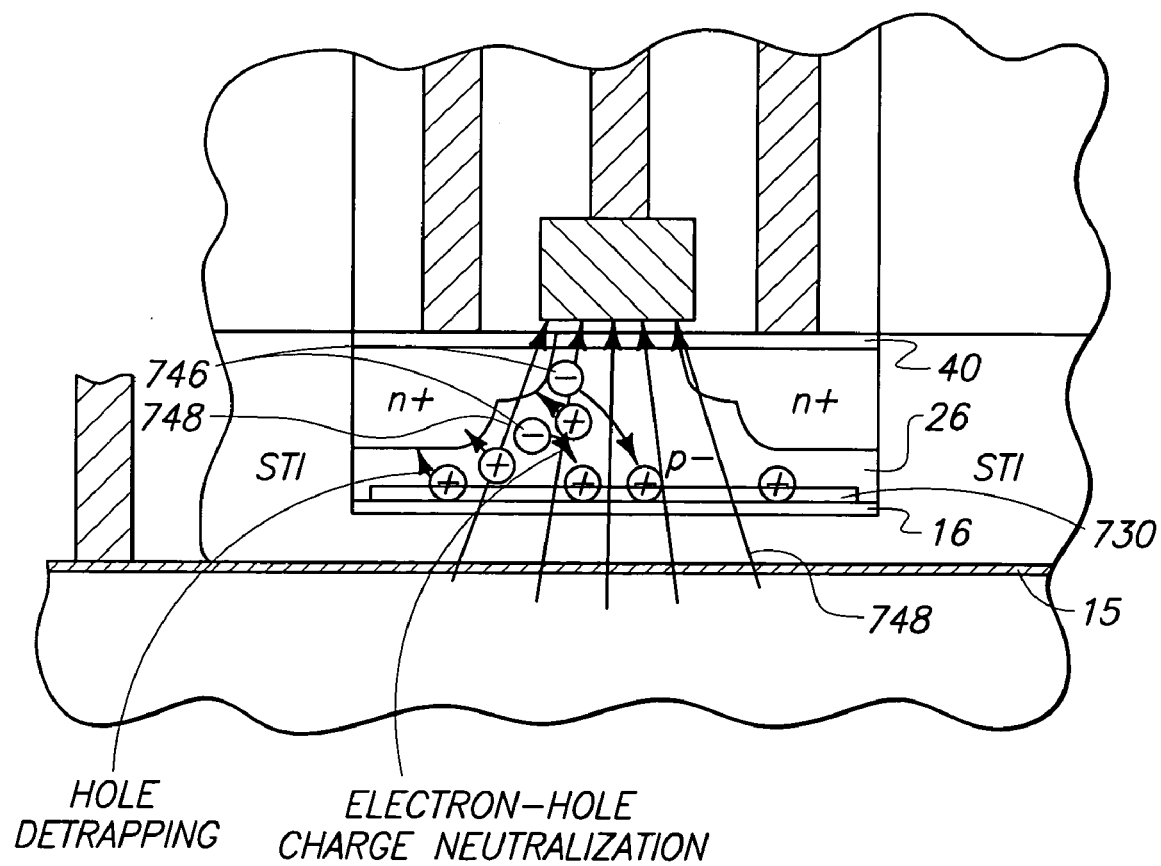

FIGS. 16A–16B illustrate an erase operation for a memory cell in an NFET-SOI mode of operation according to various embodiments of the present subject matter. A negative drain voltage pulse is applied to create an excess negative charge in the body. Additionally, a positive substrate voltage is applied in a timely sequence. An EMF field 748 is thereby set up from the substrate to the gate to attract the excess electrons 746 toward the charge trapping region 730 which then neutralizes the trapped holes in the charge trapping region. The neutralization of the previously trapped positive charge lowers the body potential and consequently raises the threshold voltage ($V_T$) of the transistor.

FIG. 17 illustrates electrical waveforms associated with writing and erasing a memory cell in a FET mode of operation according to various embodiments of the present subject matter. A write 1 operation for a PD-SOI-NFET device involves generating excess holes and trapping the holes in the trapping layer of the body region of the device. The positive gate voltage pulse and the large drain voltage pulse, shown within the dotted line 850, causes the PD-SOI-NFET to turn on and operate in a saturated mode. An excess of positive charges (holes) are generated in the PD-SOI-NFET body due to impact ionization at the drain edge. The excess holes generated by impact ionization are directed toward the charge trapping region due to the EMF field associated with the large negative substrate voltage pulse sequentially imposed in relationship to 850, and shown within the dotted line 852.

According to various embodiments, a write 0 operation, also referred to as an erase operation, for the PD-SOI-NFET device involves neutralizing the trapped holes with electrons generated in the body region of the device. Electrons are generated in the body region by forward biasing the p–n+ junction using a negative drain pulse and a positive substrate pulse, shown within the dotted line 854. The generated electrons drift toward the charge trapping region, where the electrons neutralize the stored holes. The positive substrate pulse extends for a duration longer than the negative drain pulse to provide an EMF field across the body that assists the drift of the generated electrons toward the charge trapping region.

Bipolar Junction Transistor (BJT) Mode of Operation

The lateral parasitic Bipolar Transistor mode for generating charges in the body of a PD-SOI transistor involves a relatively low field mechanism. The n-channel FET device includes a parasitic lateral NPN bipolar junction transistor (BJT). Various voltages are applied to the memory cell to cause the NPN transistor to generate positive charges (holes). In various embodiments, the generated positive charge is directed toward the charge trapping region in the body region by providing an appropriate electro-motive force (EMF) field across the body by applying an appropriate voltage difference between the gate and the substrate.

Figure 18A:
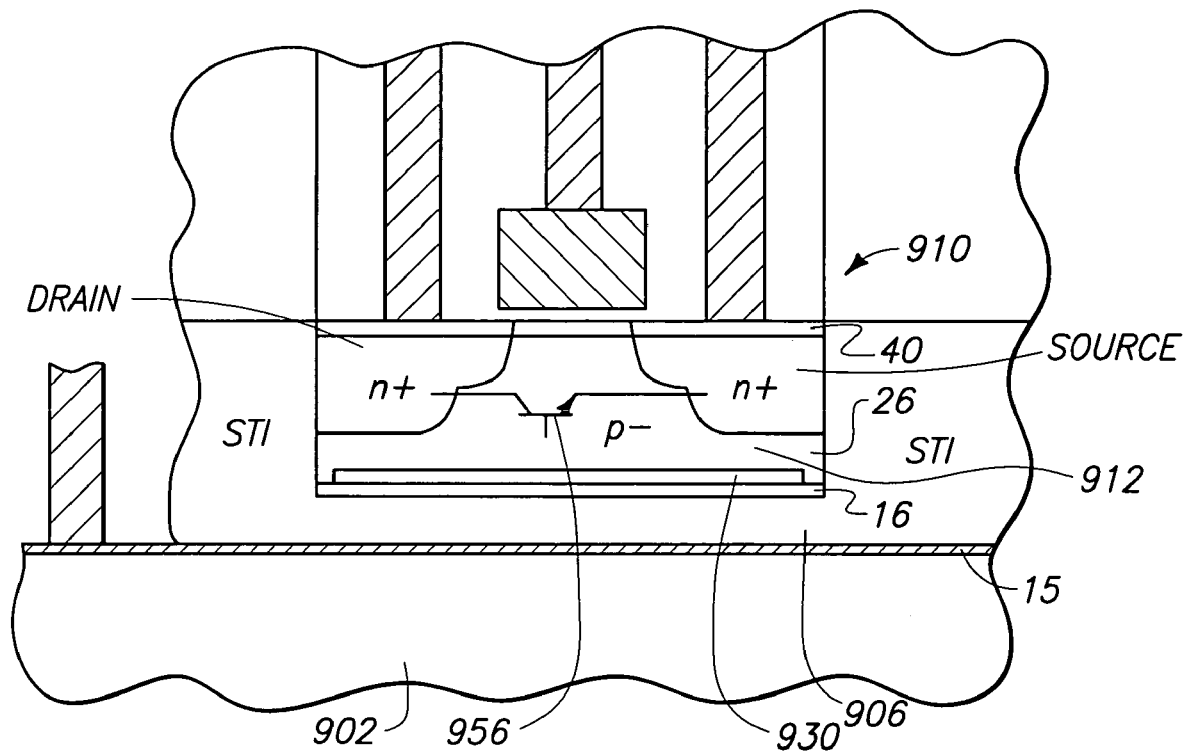
FIGS. 18A–18B illustrate a lateral parasitic bipolar junction transistor (BJT) associated with a FET device in the memory cell according to various embodiments of the present subject matter.
Figure 18B:
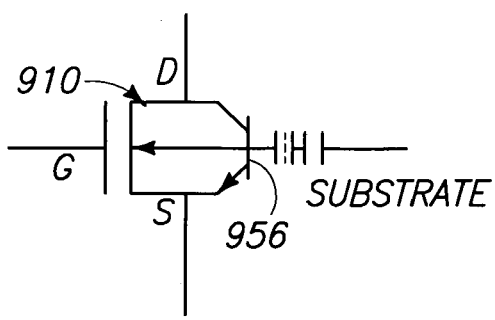

FIG. 18A–18B illustrate a lateral parasitic bipolar junction transistor (BJT) associated with a FET device in the memory cell according to various embodiments of the present subject matter. The PD-SOI-NFET transistor 910 includes a parasitic NPN transistor 956, as illustrated in FIG. 18A. One of ordinary skill in the art will understand, upon reading and comprehending this disclosure, how to apply the teachings contained herein to a parasitic lateral PNP transistor in a PD-SOI-PFET transistor.

FIG. 18B is a schematic diagram of the memory cell of the present subject matter, and generally illustrates the parasitic BJT 956 in the PD-SOI-NFET transistor 910. The substrate 902 is capacitively coupled across the BOX layer 906 to the body region 912 of the NFET transistor, which also functions as the base of the parasitic NPN transistor. The body region 912 includes charge trapping region 930, such as an SRN charge trapping layer, for example. For clarity, the body-substrate capacitor in the embodiment consists of two series capacitors: the trapping layer capacitor and the BOX capacitor between the body and the substrate, as shown.

Figure 19A:
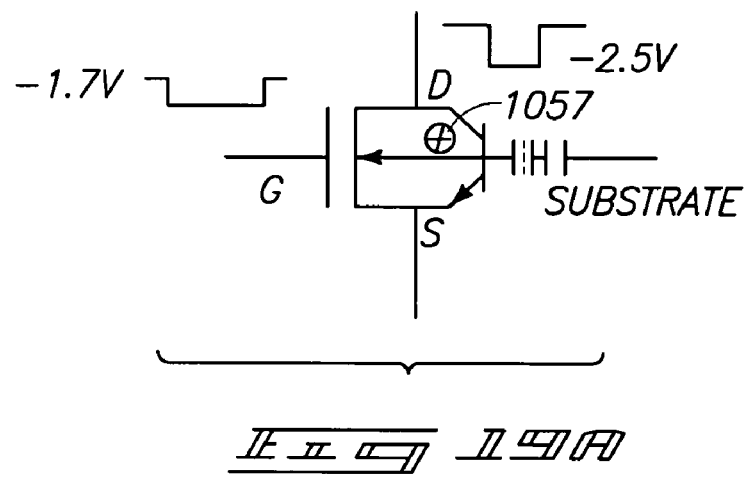
FIGS. 19A–19D illustrate a write operation for a memory cell in a parasitic BJT mode of operation according to various embodiments of the present subject matter.
Figure 19B:
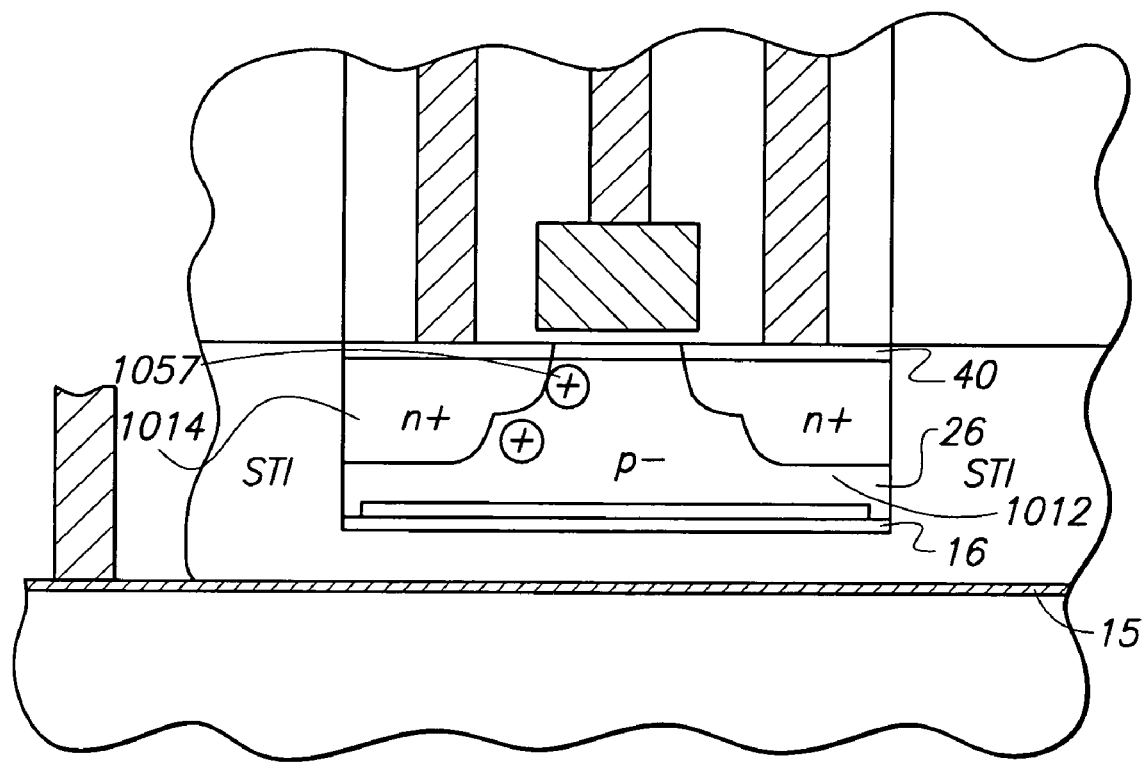
Figure 19C:
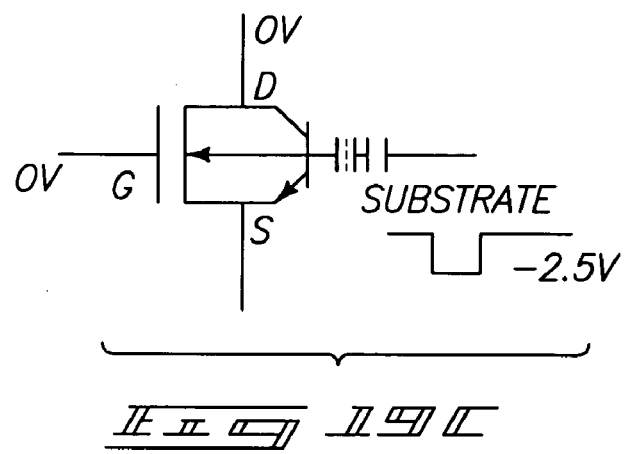
Figure 19D:
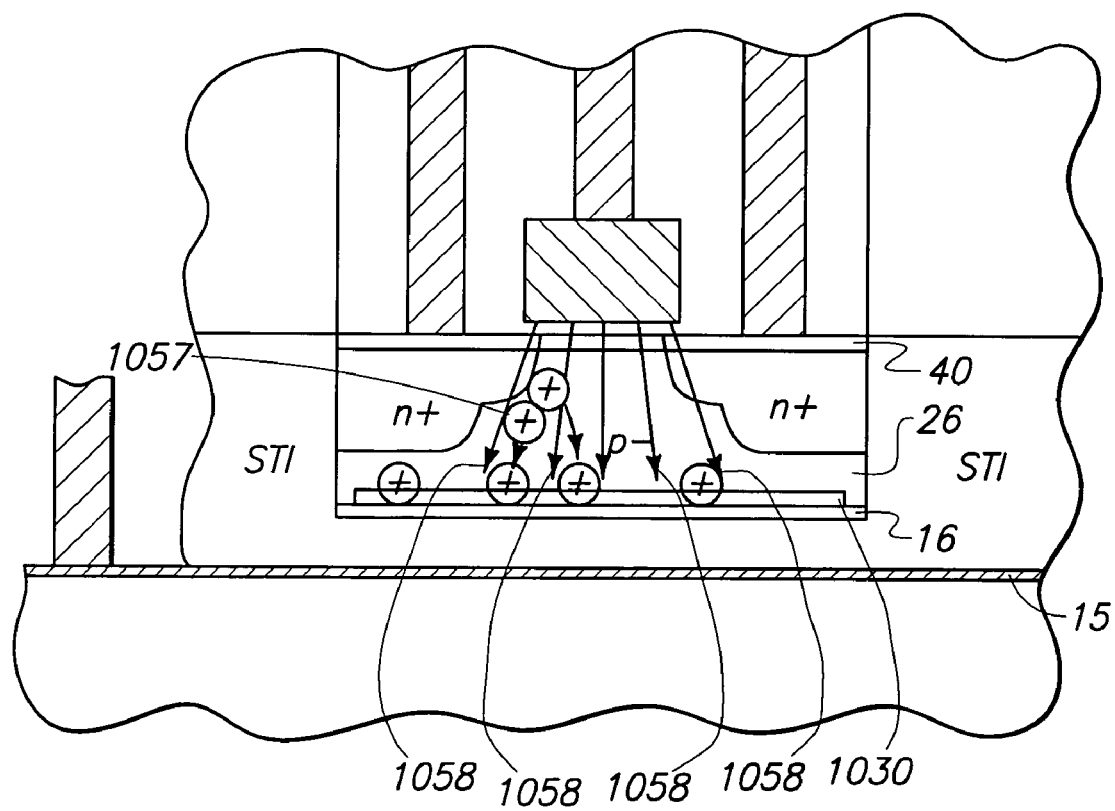

FIGS. 19A–19D illustrate a write operation for a memory cell in a parasitic BJT mode of operation according to various embodiments of the present subject matter. A negative gate pulse is applied, and a negative drain pulse (having a shorter duration than the gate pulse) is applied during the negative gate pulse (FIG. 19A). The gate voltage is capacitively coupled simultaneously to the source and the body region while forward biasing the p–n+ junction between the body region 1012 and the drain diffusion region 1014. In this condition, the lateral NPN transistor action generates excess holes 1057 near the drain region 1014 of the PD-SOI-NFET (FIG. 19B). As the gate pulse returns to ground, the substrate is pulsed negative (FIG. 19C). This negative substrate pulse provides a vertical drift field 1058 through the body from the gate to the substrate (FIG. 19D). The vertical drift field 1058 causes the generated holes 1057 to drift toward the charge trapping region 1030 in the body of the transistor. Thus, the charge trapping region stores at least a portion of the hole charges generated in the body region.

Figure 20A:
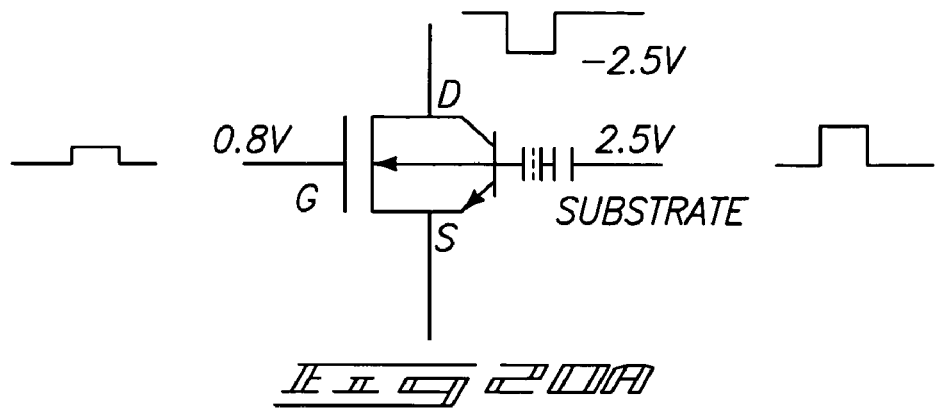
FIGS. 20A–20B illustrate an erase operation for a memory cell in a parasitic BJT mode of operation according to various embodiments of the present subject matter.
Figure 20B:
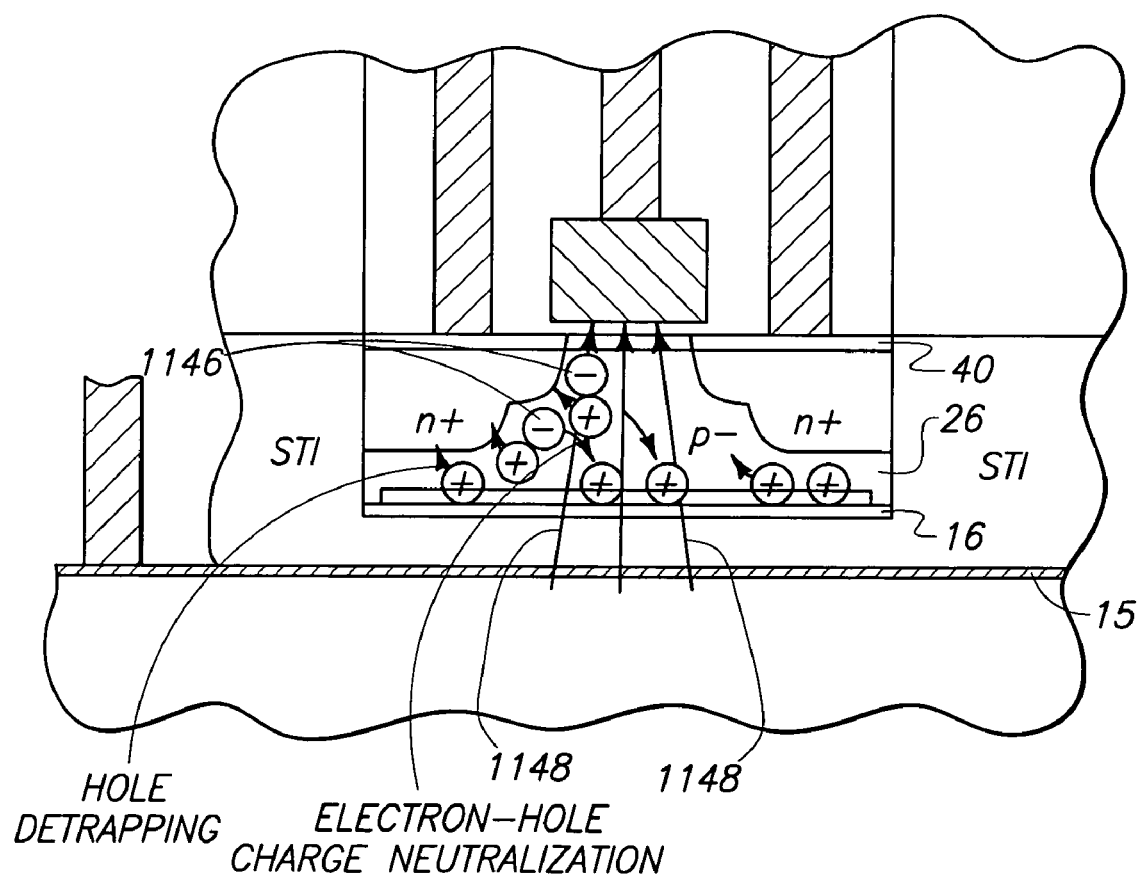

FIGS. 20A–20B illustrate an erase operation for a memory cell in a parasitic BJT mode of operation according to various embodiments of the present subject matter. The drain-body diode (n+–p) is forward biased by providing a negative drain pulse and a positive substrate pulse (FIG. 20A). The forward biased diode generates electrons 1146 in the body region (FIG. 20B). The gate is kept at a constant low positive potential as the substrate pulse is applied. The applied substrate pulse overlaps the negative drain pulse. The positive substrate voltage creates a vertical drift field 1148 to push the generated electrons 1146 toward the charge traps, which neutralizes the trapped holes in the body region of the PD-SOI-NFET device (FIG. 20B).

FIG. 21 illustrates electrical waveforms associated with writing and erasing a memory cell in a parasitic BJT mode of operation according to various embodiments of the present subject matter. A write 1 operation for a PD-SOI NFET device involves generating holes and trapping the holes in body region of the device. The negative gate voltage pulse and the large negative drain voltage pulse, shown within the dotted line 1260, causes the parasitic bipolar transistor to generate holes in the body region of the PD-SOI NFET. It is noted that the negative gate voltage pulse capacitively couples both the source and the body region, and the body region functions as the base of the parasitic BJT transistor. The body-drain junction is forward biased because the drain voltage is more negative than the gate voltage. Near the end of the gate voltage pulse, a large negative substrate voltage pulse, shown within the dotted line 1262, provides an EMF field that directs the generated holes toward the charge trapping region.

A write 0 operation, also referred to as an erase operation, for the PD-SOI NFET device involves neutralizing the trapped holes with electrons generated in the body region of the device. A small positive voltage, illustrated by the dotted line 1264, is applied to the gate. Electrons are generated in the body region by forward biasing the p–n+ junction using a negative drain pulse and a positive substrate pulse, shown within the dotted line 1266. The electron drift is toward the charge traps, where the electrons neutralize the stored holes. The positive substrate pulse extends for a duration longer than the negative drain pulse, allowing the substrate pulse and the gate potential to provide an EMF field that assists the drift of the generated electrons toward the charge centers of the charge trapping region (charge trapping layer).

The following table provides one example of an approximate BJT mode of operation in which Vdd=2.5 V.

| OPERATION | BIT-LINE | WORD-LINE | SUBSTRATE | REMARKS |
| --- | --- | --- | --- | --- |
| Write "1" | −2.5 V<br>1–5 ns | −1.7 V<br>2–10 ns | −2.5 V<br>2–10 ns | Holes are generated in the body and are trapped in the trapping layer. $V_T$ is reduced by 200 mV. |
| Write "0" | −2.5 V<br>1–5 ns | 0.8 V | 2.5 V<br>2–10 ns | Electrons are generated in the body and neutralize the trapped holes. $V_T$ returns to original value. |
| Half-Select Cells | 0.3 V | As above. | As above. | No change. |
| Read "1" | 0.3 V | 0.8 V | Gnd | Current is 2–3 orders of magnitude higher. |
| Read "0" | 0.3 V | 0.8 V | Gnd | Current is lower. Device threshold is designed to put the device in sub-threshold operation for a Read "0" operation. |

Scalability Of Memory Cell

According to various embodiments, the memory cell is fully scalable. The functionality of the memory cell is independent of the feature size. The cell density directly benefits from the reduction in feature size. Additionally, contrary to the characteristics of the conventional DRAM cell, this memory cell improves in functionality and characteristics as the feature size is reduced due to the following reasons. One reason is that the device short channel effect improves due to the reduction in the volume of neutral region of the body and due to the "narrow-width-effect" that raises the "base" threshold of the device. Another reason is that charge trapping efficiency is improved due to the increase in carrier energy of the excess carriers as the body volume is reduced. The device leakage is also reduced due to both of these reasons. Additionally, trapped charges extend the body depletion regions, reducing device parasitic capacitance. This further improves intrinsic device switching speed.

System Level

Figure 22:
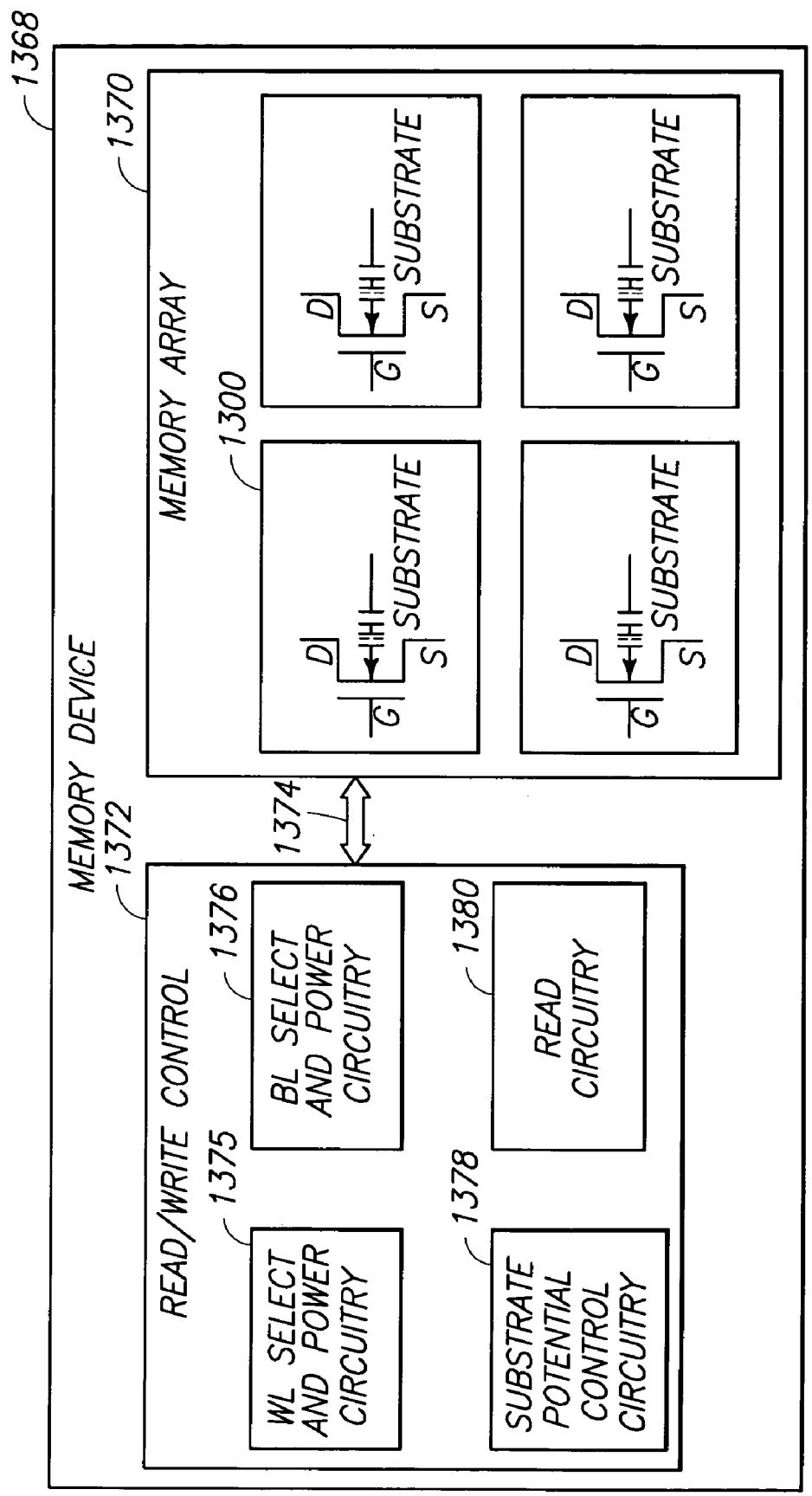
FIG. 22 is a simplified block diagram of a high-level organization of various embodiments of a memory device according to various embodiments of the present subject matter.

FIG. 22 is a simplified block diagram of a high-level organization of various embodiments of a memory device according to various embodiments of the present subject matter. The illustrated memory device 1368 includes a memory array 1370 and read/write control circuitry 1372 to perform operations on the memory array via communication line(s) 1374.

The memory array 1370 includes a number of one transistor SOI non-volatile memory cells 1300 as described above. Although the illustrated memory cells 1300 include PD-SOI NFET devices, the present subject matter is not limited to PD-SOI-NFET devices. The memory cells in the array are arranged in rows and columns. In various embodiments, wordlines connect the memory cells in the rows, and bitlines connect the memory cells in the columns. According to various embodiments, the memory cells in the array are formed in a single substrate. According to various embodiments, the substrate for one or more memory cells may be isolated from the substrate(s) for other memory cells. Thus, these embodiments provide the ability to provide different substrate voltages to different portions of the memory array.

The read/write control circuitry 1372 includes wordline select and power circuitry 1375, which functions to select a desired row and to provide a desired power signal or pulse to the selected row. The read/write control circuitry 1372 further includes bitline select and power circuitry 1376, which functions to select a desired column and to provide a desired power signal or pulse to the selected column. The read/write control circuitry 1372 further includes substrate potential control circuitry 1378 which functions to provide a desired power signal or pulse to the substrate. According to various embodiments in which the memory array includes a number of isolated substrates, the substrate potential control circuitry 1378 also functions to select a desired substrate to which the desired power signal or pulse is applied. The read/write control circuitry 1372 further includes read circuitry 1380, which functions to detect a memory state for a selected memory cell in the memory array 1370. According to various embodiments, the read circuitry 1380 uses a direct cell-current sense amplifier scheme such as that illustrated in FIG. 12. According to various embodiments, the read circuitry 1380 uses a reference cell and a current mode differential sense amplifier scheme such as that illustrated in FIG. 13.

Figure 23:
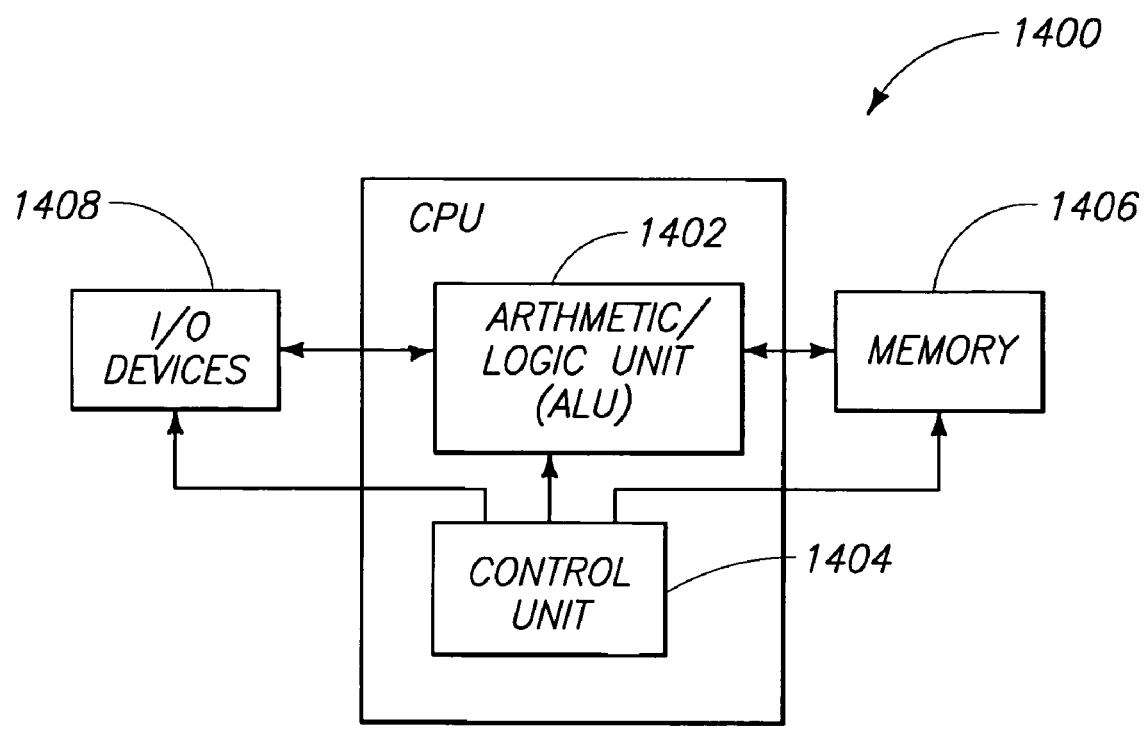
FIG. 23 is a simplified block diagram of a high-level organization of various embodiments of an electronic system according to the present subject matter.

FIG. 23 is a simplified block diagram of a high-level organization of various embodiments of an electronic system according to the present subject matter. In various embodiments, the system 1400 is a computer system, a process control system or other system that employs a processor and associated memory. The electronic system 1400 has functional elements, including a processor or arithmetic/logic unit (ALU) 1402, a control unit 1404, a memory device unit 1406 and an input/output (I/O) device 1408. Generally such an electronic system 1400 will have a native set of instructions that specify operations to be performed on data by the processor 1402 and other interactions between the processor 1402, the memory device unit 1406 and the I/O devices 1408. The control unit 1404 coordinates all operations of the processor 1402, the memory device 1406 and the I/O devices 1408 by continuously cycling through a set of operations that cause instructions to be fetched from the memory device 1406 and executed. According to various embodiments, the memory device 1406 includes, but is not limited to, random access memory (RAM) devices, read-only memory (ROM) devices, programmable ROM (PROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include one-transistor, SOI memory cells in accordance with the present subject matter. Such memory cells can be, in particular aspects, non-volatile devices.

The illustration of the system 1400 is intended to provide a general understanding of one application for the structure and circuitry of the present subject matter, and is not intended to serve as a complete description of all the elements and features of an electronic system using one-transistor, SOI memory cells according to the present subject matter. As one of ordinary skill in the art will understand, such an electronic system can be fabricated in single-package processing units, or even on a single semiconductor chip, in order to reduce the communication time between the processor and the memory device.

Applications containing one-transistor, SOI memory cells, as described in this disclosure, include electronic systems for use in memory modules, device drivers, power modules, communication modems, processor modules, and application-specific modules, and may include multilayer, multichip modules. Such circuitry can further be a subcomponent of a variety of "smart" electronic systems, such as a programmable clock, a programmable television, a programmable cell phone, a programmable personal computer, a programmable automobile, a programmable industrial control system, a programmable aircraft, and others.

Silicon Rich Insulators as Charge Trapping Layer

According to various embodiments of the present subject matter, a silicon-rich-insulator (SRI), such as silicon-rich-nitride (SRN) or silicon-rich-oxide (SRO), is used to provide charge traps in the body region of PD-SOI-FET devices. In various embodiments, a layer of SRI is formed in the body region near an interface between the body region and the BOX layer. One of ordinary skill in the art will understand, upon reading and comprehending this disclosure, that FIGS. 24–28 further describe SRI material.

Figure 24:
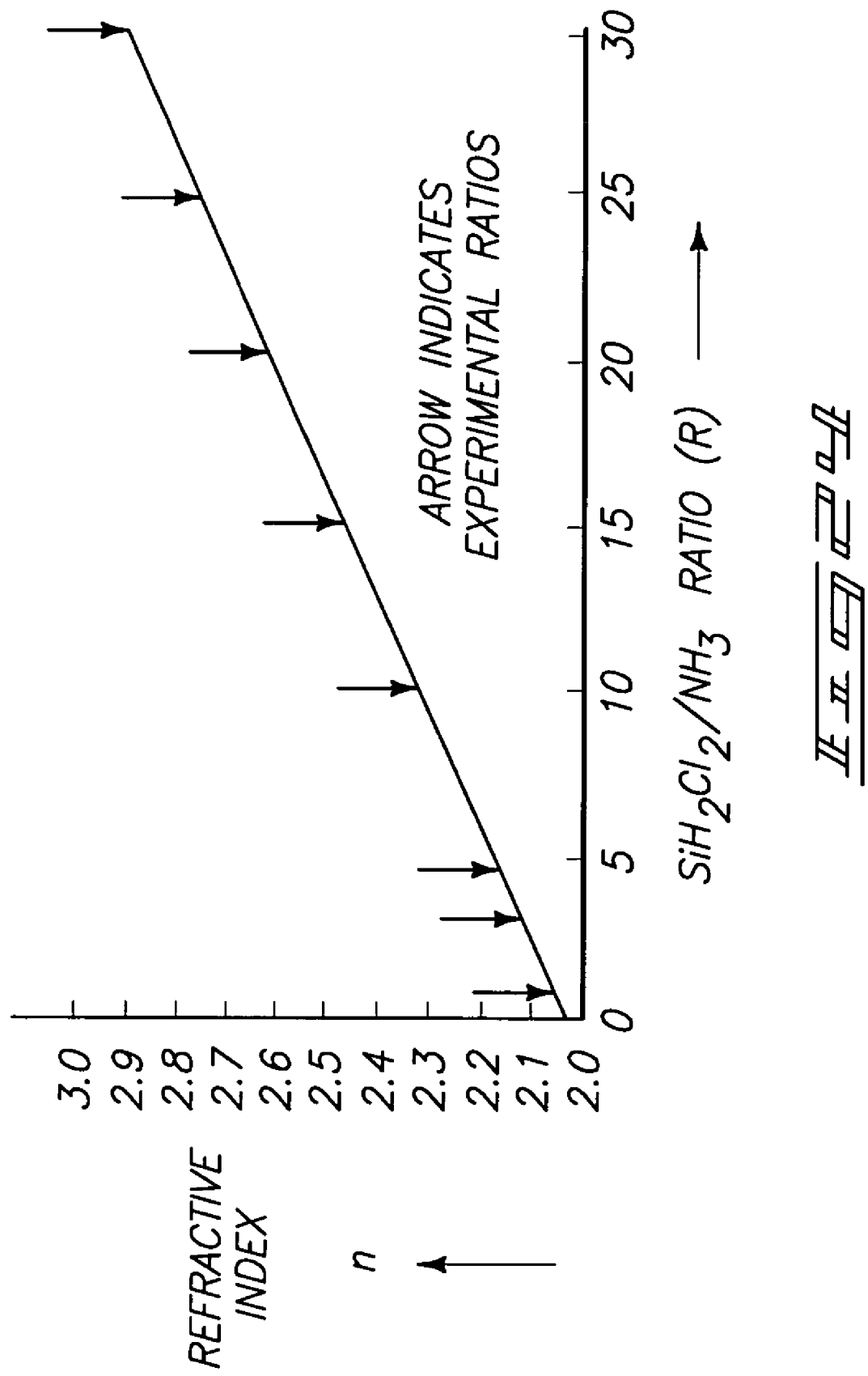
FIG. 24 is a graph showing refractive index of silicon-rich silicon nitride films versus $SiH_2Cl_2/NH_3$ flow rate ratio.

FIG. 24 is a graph showing refractive index of silicon-rich silicon nitride films versus $SiH_2Cl_2/NH_3$ flow rate ratio (R). This graph is provided herein to illustrate the relationship between the silicon amount and the refractive index. The graph indicates that the index of refraction increases linearly with increasing silicon content. As such, the index of refraction of the films can be used as an indication of the silicon content of the films.

Figure 25:
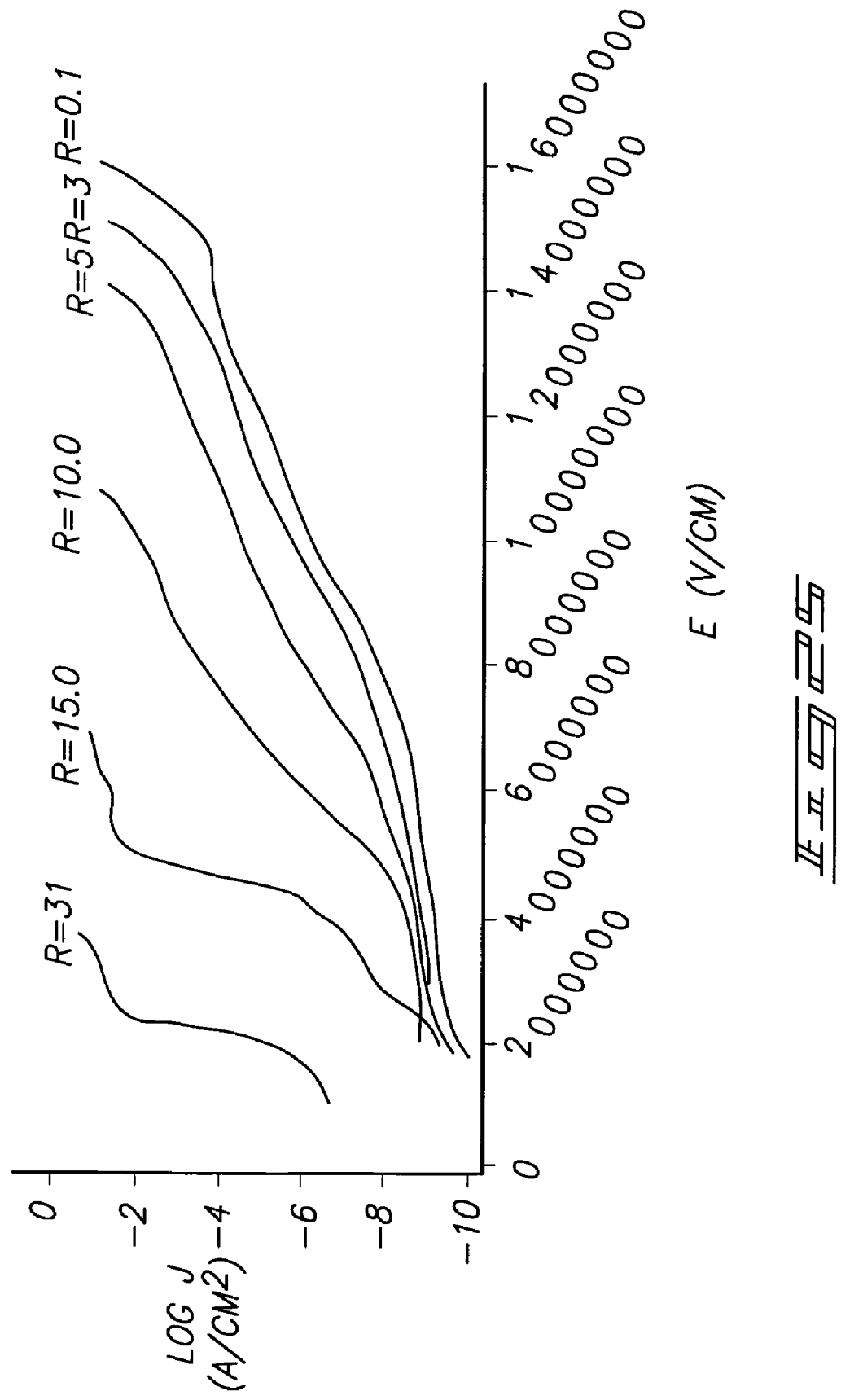
FIG. 25 is a graph showing current density versus applied field for silicon-rich silicon nitride films having different percentages of excess silicon.

FIG. 25 is a graph showing current density versus applied field for silicon-rich silicon nitride films having different percentages of excess silicon. The current density (J) is represented in amperes/cm$^2$, and log J is plotted against the electric field E (volts/cm) for $Si_3N_4$ layers having a $SiH_2Cl_2/NH_3$ flow rate ratio R of 0.1, 3, 5, 10, 15 and 31. This graph is provided herein to illustrate the relationship between the amount of silicon and the conductivity of the film. The plot shows that the $Si_3N_4$ layers having small additions of silicon (R=3 and 5) exhibit a relatively small conductivity increase over stoichiometric $Si_3N_4$. The plot further shows that increasing silicon content at or above R=10 substantially increases or enhances the conductivity.

FIGS. 26 and 27 provide graphs that illustrate the relationship between the flatband shift and applied fields for films having varying percentages of excess silicon as represented by the $SiH_2Cl_2/NH_3$ flow rate ratio R. FIG. 26 is a graph showing flatband shift versus time at an applied field of $4 \times 10^6$ volts/cm for silicon-rich silicon nitride films having varying percentages of excess silicon. For R=3, the flatband shift is greater than the shifts produced by films having an R of 0.1, 10 or 15. The film having an R of 10 provides a greater flatband shift than a film having an R of 15. FIG. 27 is a graph showing flatband shift versus time at an applied field of $7 \times 10^6$ volts/cm for silicon-rich silicon nitride films having varying percentages of excess silicon. The flatband shift produced by the R=3 film is even greater than that shown in FIG. 26, while the shifts produced by the R=10 and R=15 films do not change as appreciably. FIGS. 26 and 27 are provided to illustrate the characteristics of a charge storing medium and a more conductive charge injector medium as further explained below.

The graphs of FIGS. 24–27, which were described above, indicate that at low additional silicon content, silicon-rich $Si_3N_4$ films function as a charge storing medium as they exhibit appreciably enhanced trapping characteristics (as shown by the high flatband shifts at moderate and high applied electric fields in FIGS. 26 and 27, respectively) without exhibiting appreciably enhanced conductivity characteristics as shown in FIG. 25.

Silicon-rich silicon nitride films deposited at an R of 3 or 5 (for a refractive index of 2.10 and 2.17, respectively) will possess a charge storing function or property normally provided by a polysilicon floating gate of a EEPROM cell. In general, silicon-rich nitride films having an R greater than 0.1 and less than 10 (or, more specifically, having an index of refraction between approximately 2.10 and 2.30) will provide appreciably enhanced charge trapping or charge storing properties without providing appreciably enhanced charge conduction. This charge trapping is characteristic of a charge storing medium that can be used as a charge trapping material in the present subject matter.

Silicon-rich nitride films having an R greater than 10 (or, more specifically, having an index of refraction greater than 2.3) are referred to as an injector medium. A silicon-rich $Si_3N_4$ (SRN) injector provides appreciably enhanced charge conductance without providing appreciably enhanced charge trapping over stoichiometric $Si_3N_4$. This is illustrated in FIGS. 26 and 27, which shows progressively reduced flatband shifts for R=10 and R=15 with progressively increased conduction.

FIG. 28 is a graph showing apparent dielectric constant K versus refractive index for both Silicon Rich Nitride (SRN) and Silicon Rich Oxide (SRO). The SRN and SRO plotted in this graph were provided using a Low Pressure Chemical Vapor Deposition (LPCVD) process. The SRO was fabricated at approximately 680° C., and the fabricated structure included 100 Å oxide and 150 Å SRO. The SRN was fabricated at approximately 770° C., and the fabricated structure included 45 Å oxide and 80 Å SRN. As shown in the graph, the dielectric constant of silicon is around 12. Materials with a higher K than silicon are conventionally termed a high K material, and materials with a lower K than silicon are conventionally termed a low K material. SRN that has a refractive index of 2.5 or greater and SRO that has a refractive index of 1.85 or greater have apparent dielectric constants that are greater than 12. Injector SRI includes these high K SRO and high K SRN. Charge-centered SRI includes low K SRO and low K SRN.

Memory Cell Fabrication Using Charge Trapping SRI Layer

The processing of the memory cell of the present subject matter involves standard processing associated with PD-SOI device fabrication. The channel implant is adjusted to appropriately tailor the FET threshold. According to various embodiments, the BOX-body interface includes a trapping layer, such as an SRI layer.

Various embodiments create the trapping layer using the following process. Standard processing steps are performed through the shallow trench isolation (STI). A block mask is applied to define and open the active retention of the FET device. In these embodiments, the FET device is an NFET device, but the present subject matter is not limited to NFET devices. Silicon, ammonia ($NH_3$), and optionally hydrogen are ion implanted with an appropriate energy and concentration to achieve a desired refractive index after post-processing anneal. In various embodiments, ammonia is replaced by active nitrogen. In various embodiments, silicon is replaced by other active silicon sources such as silane, dichlorosilane, and the like. A post-implant inert anneal is performed. According to various embodiments, the anneal includes a rapid thermal anneal (RTA). According to various embodiments, the anneal includes an inert plasma anneal in nitrogen. Standard PD-SOI CMOS fabrication steps are capable of being performed thereafter to complete the fabrication of the memory cell.

Other Charge Trapping Layers

Although SRI layers are specifically cited as "charge trapping layers," many other charge trapping materials are used as a charge trapping medium in many other embodiments. For example, appropriate compositions of oxynitrides, transition metal-oxides, metal silicides and composites or laminates can be used to form charge trapping layers; and accordingly the charge trapping layers can, for example, comprise, consist essentially of, or consist of silicon oxynitrides, transition metal oxide and/or metal silicide. Nanovoids also can be used to form charge trapping layers. These examples are not intended to be an exhaustive list of the number of ways to form charge trapping layers that can be used according to the present subject matter. One of ordinary skill in the art will understand that such layers are incorporated by appropriate fabrication processes.

The present subject matter relates, in particular aspects, to non-volatile SOI memory cells. The present subject matter exploits the floating body effect associated with SOI-FET devices. The memory cell includes charge trapping regions in the body region of a SOI-FET device. Charges generated by the floating body effect are stored in the charge trapping regions to provide a first memory state, and the stored charges are neutralized to provide a second memory state. The threshold voltage of the SOI-FET is affected by the stored charges. Thus the channel conductance is capable of being used to determine the state of the memory cell.

The present subject matter is capable of providing non-volatile memories. Memories according to some aspects of the present subject matter are capable of maintaining data integrity for up to ten years without refresh. Additionally, the present subject matter is capable of providing non-volatile memories that can be written using the power supply voltage. Thus, the present subject matter does not require the complicated circuitry to generate and deliver 4 to 8 times the power supply voltage such as is required by Flash, EEPROM and the like. Additionally, the present subject matter is capable of providing memories with an effectively unlimited number of write-erase cycles during the system lifetime ($10^{13}$ to $10^{14}$ write-erase cycles in 10 years). Additionally, the present subject matter is capable of providing memories that have fast read and write operations on the order of nanoseconds rather than milliseconds. Additionally, the present subject matter is capable of providing dense memories ($4F^2$).

Previously, a specific memory type (DRAM, SRAM, ROM, Flash, and the like) was used in specific applications to provide the desired memory characteristics for the specific applications. One of ordinary skill in the art will appreciate, upon reading and comprehending this disclosure, that in view of the above-identified capabilities in a single memory type, the present subject matter is capable of providing the desirable memory characteristics for a wide range of applications. Thus, the memory for systems that have a number of specific memory applications can be economically fabricated according to the present subject matter.

Utilization of Si/Ge layer 26 can improve performance of the devices of FIGS. 10–23 relative to prior art devices having source/drain regions extending into materials consisting of conductively-doped silicon. The performance of the devices can be further enhanced by utilizing a layer 26 having a relaxed crystalline lattice in combination with a layer 40 having a strained crystalline lattice for reasons similar to those discussed above with reference to FIGS. 1–9.

Several of the figures show various different dopant levels, and utilize the designations p+, p, p−, n−, n and n+ to distinguish the levels. The difference in dopant concentration between the regions identified as being p+, p, and p− are typically as follows. A p+ region has a dopant concentration of at least about $10^{20}$ atoms/cm$^3$, a p region has a dopant concentration of from about $10^{14}$ to about $10^{18}$ atoms/cm$^3$, and a p− region has a dopant concentration in the order of or less than $10^{16}$ atoms/cm$^3$. It is noted that regions identified as being n−, n and n+ will have dopant concentrations similar to those described above relative to the p−, p and p+ regions respectively, except, of course, the n regions will have an opposite-type conductivity enhancing dopant therein than do the p regions.

The p+, p, and p− dopant levels are shown in the drawings only to illustrate differences in dopant concentration. It is noted that the term "p" is utilized herein to refer to both a dopant type and a relative dopant concentration. To aid in interpretation of this specification and the claims that follow, the term "p" is to be understood as referring only to dopant type, and not to a relative dopant concentration, except when it is explicitly stated that the term "p" refers to a relative dopant concentration. Accordingly, for purposes of interpreting this disclosure and the claims that follow, it is to be understood that the term "p-type doped" refers to a dopant type of a region and not a relative dopant level. Thus, a p-type doped region can be doped to any of the p+, p, and p− dopant levels discussed above. Similarly, an n-type doped region can be doped to any of the n+, n, and n− dopant levels discussed above.

One of the advantages of methodology of the present invention is that it enables non-volatile memory to be formed over a vast array of substrates. The substrates can be suitable for a variety of applications. In some aspects the substrates can be, for example, relatively inexpensive to manufacture, physical flexible, physically stiff, traditional semiconductor substrates, or very non-traditional substrates.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A field effect transistor construction, comprising:
   a crystalline material which includes silicon and germanium;
   a body region within the crystalline material, the body region including a charge trapping region which contains silicon-rich-nitride; an entirety of the body region within the crystalline material being within a single crystal of the crystalline material;
   a first diffusion region and a second diffusion region within the body region;
   a channel region within the body region between the first and second diffusion regions; and
   a gate over the channel region.

2. The construction of claim 1 wherein the crystalline material comprises from about 10 to about 60 atomic percent germanium.

3. The construction of claim 1 wherein the crystalline material is polycrystalline.

4. The construction of claim 1 wherein the crystalline material is monocrystalline.

5. The construction of claim 1 wherein the crystalline material has a relaxed crystalline lattice, and further comprising a strained crystalline lattice layer between the relaxed crystalline lattice and the gate.

6. The construction of claim 5 wherein the strained crystalline lattice includes silicon.

7. The construction of claim 5 wherein the crystalline material comprises from about 10 to about 60 atomic percent germanium; and wherein the strained crystalline lattice includes silicon and germanium.

8. The construction of claim 5 wherein the charge trapping region is entirely contained within the relaxed crystalline lattice.

9. A field effect transistor construction, comprising:
   a crystalline layer separated from a substrate by an insulative material; the crystalline layer comprising a material which includes silicon and germanium;
   a body region within the crystalline layer, the body region including a charge trapping region which contains silicon-rich-nitride; an entirety of the body region within the crystalline layer being within a single crystal of the crystalline layer;
   first and second diffusion regions within the body region;
   a channel region within the body region between the first and second diffusion regions; and
   a gate over the channel region.

10. The construction of claim 9 wherein the substrate comprises a conductive material.

11. The construction of claim 9 wherein the substrate comprises an insulative mass, and wherein a conductive layer is between the insulative mass of the substrate and the insulative material.

12. The construction of claim 11 wherein the conductive material comprises metal.

13. The construction of claim 11 wherein the conductive material comprises conductively-doped silicon.

14. The construction of claim 9 wherein the crystalline layer is less than or equal to about 2000 Å thick.

15. The construction of claim 9 wherein the substrate comprises a semiconductive material.

16. The construction of claim 9 wherein the substrate comprises glass.

17. The construction of claim 9 wherein the substrate comprises aluminum oxide.

18. The construction of claim 9 wherein the substrate comprises silicon dioxide.

19. The construction of claim 9 wherein the substrate comprises a metal.

20. The construction of claim 9 wherein the substrate comprises a plastic.

21. The construction of claim 9 wherein the material which includes silicon and germanium comprises from about 10 to about 60 atomic percent germanium.

22. The construction of claim 9 wherein the crystalline layer has a relaxed crystalline lattice, and further comprising a strained crystalline lattice layer between the relaxed crystalline lattice and the gate.

23. The construction of claim 22 wherein the strained crystalline lattice includes silicon.

24. The construction of claim 9 wherein the crystalline layer has a relaxed crystalline lattice, and further comprising:
a strained crystalline lattice layer between the relaxed crystalline lattice and the gate; and
a silicon-containing layer between the relaxed crystalline lattice and the insulative material.

25. The construction of claim 24 wherein the charge trapping region is entirely contained within the relaxed crystalline lattice.

26. The construction of claim 24 wherein the charge trapping region is at least partially contained within the relaxed crystalline lattice.

27. A semiconductor-on-insulator field effect transistor (SOI-FET) construction, comprising:
an electrically insulative material;
a first crystalline layer over the electrically insulative material; the first crystalline layer having a relaxed crystalline lattice;
a second crystalline layer over the first crystalline layer; the second crystalline layer having a strained crystalline lattice;
a gate over the second crystalline layer;
a body region extending into the first and second crystalline layers proximate the gate, the body region including a pair of diffusion regions coupled with one another through the gate; the body region including a silicon-rich-insulator (SRI) layer; an entirety of the body region within the first crystalline layer being within a single crystal of the first crystalline layer; and
wherein the SOI-FET has a first threshold voltage associated with a non-volatile first memory state when excess charges are trapped in the SRI layer, and a second threshold voltage associated with a second memory state when trapped charges in the SRI layer are neutralized.

28. The SOI-FET construction of claim 27 wherein the electrically insulative material is physically against an electrically conductive surface of a substrate.

29. The SOI-FET construction of claim 28 wherein substrate comprises a semiconductive material.

30. The SOI-FET construction of claim 28 wherein the substrate comprises glass.

31. The SOI-FET construction of claim 28 wherein the substrate comprises aluminum oxide.

32. The SOI-FET construction of claim 28 wherein the substrate comprises silicon dioxide.

33. The SOI-FET construction of claim 28 wherein the substrate comprises a metal.

34. The SOI-FET construction of claim 28 wherein the substrate comprises a plastic.

35. The SOI-FET construction of claim 27 wherein the first crystalline layer comprises Si/Ge.

36. The SOI-FET construction of claim 35 wherein the first crystalline layer comprises from about 10 to about 60 atomic percent germanium.

37. The SOI-FET construction of claim 36 wherein the second crystalline layer comprises Si/Ge.

38. The SOI-FET construction of claim 27 wherein the SRI layer comprises silicon-rich-nitride (SRN).

39. The SOI-FET construction of claim 27 wherein the SRI layer comprises silicon-rich-oxide (SRO).

40. The SOI-FET construction of claim 27 wherein:
the body region is doped with p-type impurities;
the pair of diffusion regions are n-type regions; and
a number of excess holes generated in the body region are trapped in the SRI layer.

41. The SOI-FET construction of claim 27 wherein:
the body region is doped with n-type impurities;
the pair of diffusion regions are p-type regions; and
a number of excess electrons generated in the body region are trapped in the SRI layer.

42. The SOI-FET construction of claim 27 wherein a potential difference is applied between the gate and the substrate to provide a charge drift toward the SRI layer.

43. The SOI-FET construction of claim 27 wherein the charge to be trapped in the SRI layer is generated by impact ionization in a field effect transistor (FET) mode of operation.

44. The SOI-FET construction of claim 27 wherein the charge to be trapped in the SRI layer is generated in a lateral parasitic bipolar junction transistor (BJT) mode of operation.

45. An electronic device, comprising:
a substrate;
a memory array, including:
a crystalline Si/Ge layer formed over the substrate; and
a number of memory cells organized in a number of rows and a number of columns; at least some of the memory cells including transistors which comprise floating body regions extending into the crystalline Si/Ge layer and containing charge trapping regions which comprise silicon-rich-nitride; the at least some of the transistors including first and second diffusion regions within the body regions, and including transistor gates over the body regions; wherein at least one of the floating body regions extending within the crystalline Si/Ge layer is entirely contained within a single crystal of the crystalline Si/Ge layer; and
control circuitry operably connected to the memory array to write selected memory cells and to read selected memory cells.

46. The device of claim 45 wherein the substrate comprises a semiconductive material.

47. The device of claim 45 wherein the substrate comprises glass.

48. The device of claim 45 wherein the substrate comprises aluminum oxide.

49. The device of claim 45 wherein the substrate comprises silicon dioxide.

50. The device of claim 45 wherein the substrate comprises a metal.

51. The device of claim 45 wherein the substrate comprises a plastic.

52. The device of claim 45 wherein the crystalline layer has a relaxed crystalline lattice, and further comprising a strained crystalline lattice layer between the relaxed crystalline lattice and the gates.

53. The device of claim 52 wherein the strained crystalline lattice includes silicon.

54. The device of claim 52 wherein the crystalline Si/Ge layer comprises from about 10 to about 60 atomic percent germanium; and wherein the strained crystalline lattice includes silicon and germanium.

55. The device of claim 45 wherein the crystalline layer has a relaxed crystalline lattice, and further comprising:
a strained crystalline lattice layer between the relaxed crystalline lattice and the gates; and
a silicon-containing layer between the relaxed crystalline lattice and the substrate.

56. The device of claim 55 wherein the charge trapping regions are entirely contained within the relaxed crystalline lattice.

57. The device of claim 45 wherein the control circuitry includes substrate control circuitry to provide a desired voltage pulse to the substrate.

58. The device of claim 57 wherein:
the memory array includes more than one substrate region; and
the substrate control circuitry is adapted to provide a desired voltage pulse to a selected substrate region.

59. The device of claim 45 wherein, for a selected memory cell, the control circuitry includes circuitry to provide a desired word voltage pulse to the gate of the selected memory cell, a desired bit voltage pulse to the first diffusion region of the selected memory cell, and a desired substrate voltage pulse to the substrate of the selected memory cell.

60. The device of claim 45 wherein the control circuitry includes read circuitry to use a source current for a selected memory cell to determine the state of the selected memory cell.

61. A field effect transistor construction, comprising:
a crystalline material which includes silicon and germanium;
a body region within the crystalline material, the body region including a charge trapping region; the charge trapping region comprising silicon oxynitride, transition metal oxide, metal silicide, silicon-rich-nitride or silicon-rich-oxide;
first and second diffusion regions within the body region;
a channel region within the body region between the first and second diffusion regions; and
a gate over the channel region.

62. The construction of claim 61 wherein the charge trapping region comprises silicon oxynitride.

63. The construction of claim 61 wherein the charge trapping region comprises transition metal oxide.

64. The construction of claim 61 wherein the charge trapping region comprises metal silicide.

65. The construction of claim 61 wherein the charge trapping region comprises silicon-rich-nitride.

66. The construction of claim 61 wherein the charge trapping region comprises silicon-rich-oxide.

* * * * *

UNITED STATES PATENT AND TRADEMARK OFFICE
CERTIFICATE OF CORRECTION

PATENT NO. : 7,115,948 B2
APPLICATION NO. : 11/168697
DATED : October 3, 2006
INVENTOR(S) : Arup Bhattacharyya It is certified that error appears in the above-identified patent and that said Letters Patent is hereby corrected as shown below:

Title Page
Page 2, Col. 2, OTHER PUBLICATIONS –
  Replace "Bee, G.J. et al., "A Novel SiGe-inserted SOI Structure for High"
  With --Bae, G.J. et al., "A Novel SiGe-inserted SOI Structure for High--

Col. 3, line 19 –
  Replace "Digest, 2002, 00. 98-99; and Huang, L.J. et al., "Carrier"
  With -- Digest, 2002, pp. 98-99; and Huang, L.J. et al., Carrier--

Col. 8, lines 14-15
  Replace "can comprises can electrically insulative mass and layer 15 can be"
  With -- can comprise and electrically insulative mass and layer 15 can be--

Col. 14, line 57 –
  Replace "charge. An array of such cells can fabricated over a versatile"
  With --charge. An array of such cells can be fabricated over a versatile--

Col. 15, line 40 –
  Replace "provide wider applicability of used for the various devices."
  With -- provide wider application if used for the various devices.--

Col. 16, line 51-
  Replace "location the charge trapping region 130 is on or near the"
  With --location of the charge trapping region 130 is on or near the--

UNITED STATES PATENT AND TRADEMARK OFFICE
CERTIFICATE OF CORRECTION

PATENT NO.        : 7,115,948 B2
APPLICATION NO.   : 11/168697
DATED             : October 3, 2006
INVENTOR(S)       : Arup Bhattacharyya It is certified that error appears in the above-identified patent and that said Letters Patent is hereby corrected as shown below:

Col. 21, line 7-
  Replace "FIG. 18A-18B illustrate a lateral parasitic bipolar"
  With -- FIGS. 18A-18B illustrate a lateral parasitic bipolar--

Signed and Sealed this

Thirty-first Day of July, 2007

JON W. DUDAS
*Director of the United States Patent and Trademark Office*